United States Patent
Ikarashi et al.

(10) Patent No.: US 7,433,161 B2
(45) Date of Patent: Oct. 7, 2008

(54) SPIN-VALVE ELEMENT HAVING FIXED LAYER CONTAINING NANO-OXIDE LAYER

(75) Inventors: Kazuaki Ikarashi, Niigata-ken (JP); Naoya Hasegawa, Niigata-ken (JP); Fumihito Koike, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 290 days.

(21) Appl. No.: 11/034,386

(22) Filed: Jan. 12, 2005

(65) Prior Publication Data

US 2005/0157435 A1    Jul. 21, 2005

(30) Foreign Application Priority Data

Jan. 15, 2004   (JP) ............................. 2004-008492

(51) Int. Cl.
   *G11B 5/39* (2006.01)
(52) U.S. Cl. ................................ 360/324.11
(58) Field of Classification Search ............ 360/324.11, 360/324.1, 324.12; 29/603.13, 603.14, 603.15
   See application file for complete search history.

(56) References Cited

U.S. PATENT DOCUMENTS

| | | | |
|---|---|---|---|
| 6,407,890 B1 | 6/2002 | Gill | |
| 6,556,390 B1 * | 4/2003 | Mao et al. | 360/324.1 |
| 6,580,589 B1 | 6/2003 | Gill | |
| 6,710,984 B1 * | 3/2004 | Yuasa et al. | 360/324.11 |
| 2001/0012188 A1 * | 8/2001 | Hasegawa et al. | 360/324.12 |
| 2002/0012207 A1 | 1/2002 | Singleton et al. | |
| 2003/0035255 A1 * | 2/2003 | Hasegawa et al. | 360/324.11 |
| 2003/0192168 A1 * | 10/2003 | Li et al. | 29/603.14 |

FOREIGN PATENT DOCUMENTS

| | | |
|---|---|---|
| JP | 2002-50011 | 2/2002 |
| JP | 2002-117508 | 4/2002 |
| JP | 2002-232035 | 8/2002 |
| JP | 2002-319112 | 10/2002 |
| JP | 2002-329903 | 11/2002 |
| JP | 2002-358610 | 12/2002 |
| JP | 2002-374018 | 12/2002 |

OTHER PUBLICATIONS

Search Report dated Feb. 7, 2005 for British Patent Application No. GB0427311.6.

* cited by examiner

*Primary Examiner*—Tianjie Chen
(74) *Attorney, Agent, or Firm*—Brinks Hofer Gilson & Lione

(57) ABSTRACT

A nonmagnetic material-noncontact layer forming a fixed magnetic layer is formed using CoFe, a nonmagnetic material-contact layer is formed using Co, and an NOL (Nano-Oxide Layer) is provided between the nonmagnetic material-noncontact layer and the nonmagnetic material-contact layer. In addition, the average film thickness of the nonmagnetic material-contact layer is set in the range of 16 to 19 Å. Accordingly, compared to a three-layered structure composed of CoFe, an NOL, and CoFe or a three-layered structure composed of Co, an NOL, and Co, which has been conventionally used, the rate ($\Delta R/R$) of change in resistance and the unidirectional exchange bias magnetic field (Hex*) can both be improved.

20 Claims, 12 Drawing Sheets

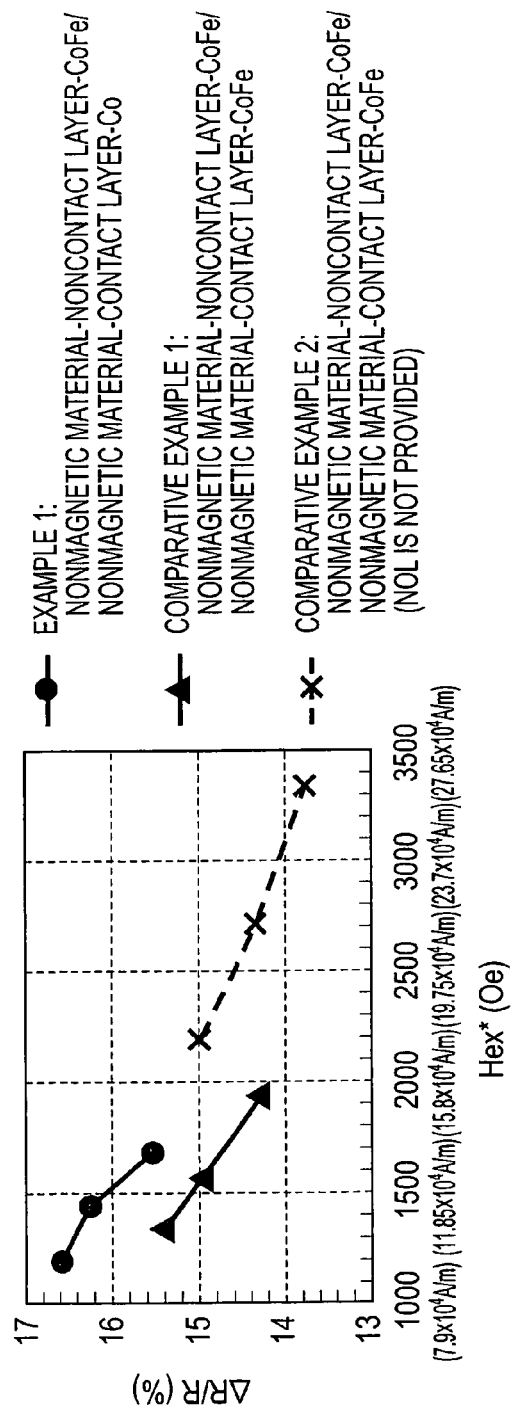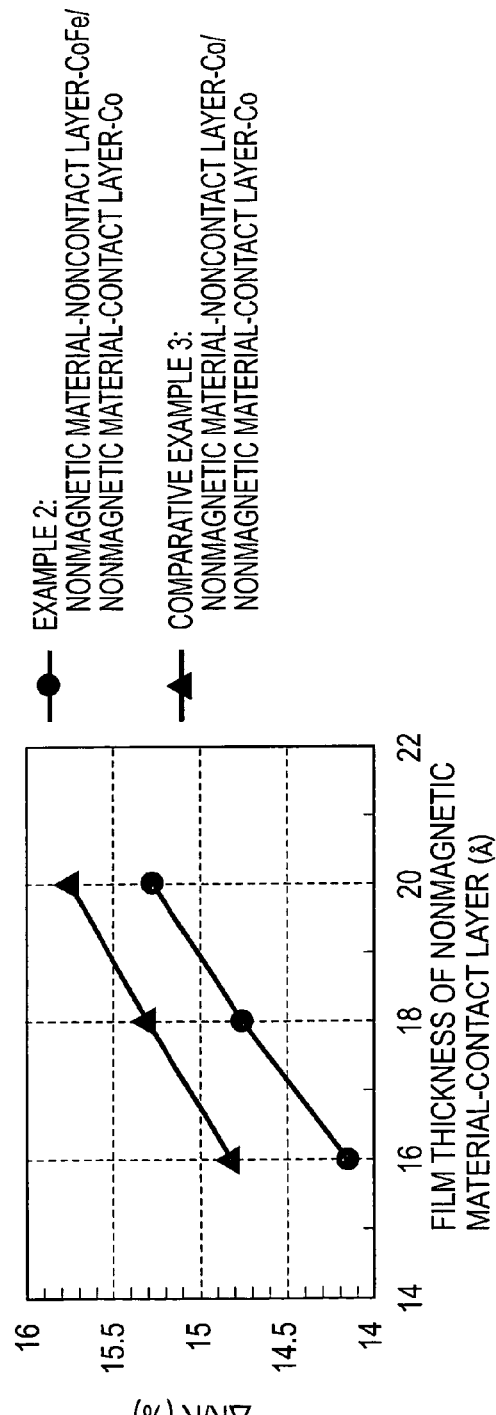

SPIN-VALVE ELEMENT HAVING FIXED LAYER CONTAINING NANO-OXIDE LAYER

This application claims the benefit of priority to Japanese Patent Application 2004-008492, filed on Jan. 15, 2004, which is incorporated herein by reference.

TECHNICAL FIELD

The present application relates to magnetic sensors which can obtain a high rate ($\Delta R/R$) of change in resistance and a unidirectional exchange bias magnetic field (Hex*) by selecting an optimum material and film thickness of a fixed magnetic layer.

BACKGROUND

In Japanese Unexamined Patent Application Publication No. 2002-232035, a mirror reflection layer is provided inside a fixed magnetic layer forming a spin valve thin film element. In order to obtain a mirror reflection effect, an NOL (Nano-Oxide Layer) is provided. "Ta 3 nm/NiFeCr 2 nm/CoFe 1.5 nm/NiFeCr 1 nm/PtMn 10 nm/CoFe 0.5 nm/NOL/CoFe 2 nm/Cu 2.3 nm/CoFeNi 2 nm/Cu 1 nm/TaO 1 nm . . . " is described, and the fixed magnetic layer has a three-layered structure composed of a CoFe layer 0.5 nm thick, an NOL, and a CoFe layer 2 nm thick provided in that order.

In addition, a method for manufacturing an NOL is described where the NOL is to be formed by oxidation of a surface of a CoFe layer forming the fixed magnetic layer using plasma oxidation or the like.

An object is to obtain a preferable bias point and a high rate of change in resistance.

In Japanese Unexamined Patent Application Publication No. 2002-117508, a ferromagnetic fixed magnetic layer 15 having a laminated structure is disclosed, for example, in FIG. 3 thereof, and the ferromagnetic fixed magnetic layer 15 has a synthetic ferrimagnetic pinned structure formed of ferromagnetic films with an antiparallel coupling layer 150 made of Ru or the like interposed therebetween. The magnetizations of the ferromagnetic films formed on the top and the bottom of the antiparallel coupling layer 150 are fixed antiparallel with each other. After various experiments which will be described later were carried out by the inventors of the present invention, it was found that the rate ($\Delta R/R$) of change in resistance is not effectively increased in a spin valve thin film element having the structure described in Japanese Unexamined Patent Application Publication No. 2002-232035.

That is, although the three-layered structure composed of the CoFe layer, the NOL, and the CoFe layer was used as the fixed magnetic layer, according to the experiments which will be described later, compared to the structure in which the NOL was not provided for the fixed magnetic layer, the rate ($\Delta R/R$) of change in resistance was not so much improved as expected.

In addition, as another embodiment, when an experiment was performed using a three-layered structure composed of a Co layer, an NOL, and a Co layer as a fixed magnetic layer, it was found that, although the rate ($\Delta R/R$) of change in resistance is increased as that of the three-layered structure composed of the CoFe layer, the NOL, and the CoFe layer, the unidirectional exchange bias magnetic field (Hex*) is considerably decreased. The unidirectional exchange bias magnetic field (Hex*) is the intensity of a magnetic field including an exchange coupling magnetic field generated between the fixed magnetic layer and an antiferromagnetic layer, a coupling magnetic field by the RKKY interaction generated between magnetic layers when the fixed magnetic layer has a synthetic ferrimagnetic pinned structure, and the like.

In addition, according to the experiments which will be described later, it was found that the rate ($\Delta R/R$) of change in resistance and the unidirectional exchange bias magnetic field (Hex*) are considerably changed, particularly by the film thickness of a magnetic layer formed between the NOL and a nonmagnetic material layer made of Cu or the like, the shape of the NOL, and the like. Hence, the inventors of the present invention intended to optimize materials and film thicknesses of magnetic layers provided on the top and the bottom of the NOL and the shape thereof so that the rate ($\Delta R/R$) of change in resistance and the unidirectional exchange bias magnetic field (Hex*) are further increased as compared to those obtained in the past, and as a result, the present invention was made.

SUMMARY

A magnetic sensor which can obtain a high rate ($\Delta R/R$) of change in resistance and unidirectional exchange bias magnetic field (Hex*), in particular, when an NOL having a mirror reflection effect is used inside a fixed magnetic layer, by selecting an optimum material and film thickness of the fixed magnetic layer and, in addition, by optimizing the shape of the NOL is described.

In accordance with a first aspect, a magnetic sensor is provided, comprising a laminate composed of at least an antiferromagnetic layer, a fixed magnetic layer in which a magnetization direction thereof is fixed, a nonmagnetic material layer, and a free magnetic layer in which a magnetization thereof varies in accordance with an external magnetic field, the layers being provided in that order from the bottom.

In the magnetic sensor described above, the fixed magnetic layer has a nonmagnetic material-contact layer formed in contact with the nonmagnetic material layer, a nonmagnetic material-noncontact layer formed at the antiferromagnetic layer side, and an NOL formed between the nonmagnetic material-contact layer and the nonmagnetic material-noncontact layer by oxidation of the surface of the nonmagnetic material-noncontact layer, in which the NOL has a mirror reflection effect. The nonmagnetic material-contact layer is formed of Co, the nonmagnetic material-noncontact layer is formed of a CoFe alloy, and the average film thickness of the nonmagnetic material-contact layer is formed in the range of 16 to 19 Å.

As described above, the fixed magnetic layer is composed of the nonmagnetic material-noncontact layer formed of CoFe, and the nonmagnetic material-contact layer formed of Co. The NOL described above is formed by oxidation of the surface of the nonmagnetic material-noncontact layer.

In addition to the optimization of the materials described above, since the average film thickness of the nonmagnetic material-contact layer is set in the range of 16 to 19 Å, it was found that, compared to a three-layered structure composed of CoFe, an NOL, and CoFe or a three-layered structure composed of Co, an NOL, and Co, which has been conventionally used, the rate ($\Delta R/R$) of change in resistance and the unidirectional exchange bias magnetic field Hex* can both be improved to a satisfactory level.

The fixed magnetic layer may have a synthetic ferrimagnetic pinned structure composed of a first fixed magnetic layer, a nonmagnetic interlayer, and a second fixed magnetic layer provided in that order from the bottom, and the second fixed magnetic layer may have a structure composed of the nonmagnetic material-noncontact layer, the NOL, and the nonmagnetic material-contact layer provided in that order from the bottom.

When the structure is as described above, a higher rate ($\Delta R/R$) of change in resistance and unidirectional exchange bias magnetic field (Hex*) can be obtained.

In addition, in accordance with a second aspect, a magnetic sensor is provided comprising a laminate composed of at least a fixed magnetic layer, a nonmagnetic material layer, and a free magnetic layer provided in that order from the bottom.

The fixed magnetic layer has a synthetic ferrimagnetic pinned structure composed of a first fixed magnetic layer, a nonmagnetic interlayer, and a second fixed magnetic layer provided in that order from the bottom, in which the magnetization of the fixed magnetic layer is fixed by a unidirectional anisotropy thereof. In addition, the second fixed magnetic layer has a laminate structure composed of a nonmagnetic material-noncontact layer, an NOL which is formed by oxidation of the surface of the nonmagnetic material-noncontact layer and which has a mirror reflection effect, and a nonmagnetic material-contact layer provided in that order from the bottom, and the nonmagnetic material-contact layer is formed of Co, the nonmagnetic material-noncontact layer is formed of a CoFe alloy, and the average film thickness of the nonmagnetic material-contact layer is formed in the range of 16 to 19 Å.

This type of magnetic sensor is a so-called self-pinning magnetic sensor in which the magnetization of the fixed magnetic layer is fixed by the unidirectional anisotropy thereof.

Accordingly, compared to a magnetic sensor having a thick antiferromagnetic layer, the shunt loss can be decreased, and the magnetic field detection output of the magnetic sensor can be improved. In addition, since the distance between shield layers provided at the top and the bottom of the magnetic sensor can be decreased, further improvement in recording density of a recording medium can be achieved.

In a self-pinning magnetic sensor, the fixed magnetic layer has a synthetic ferrimagnetic pinned structure. In addition, since the second fixed magnetic layer forming the fixed magnetic layer is formed of the nonmagnetic material-noncontact layer, the NOL, and the nonmagnetic material-contact layer, the nonmagnetic material-contact layer is formed of Co, the nonmagnetic material-noncontact layer is formed of a CoFe alloy, and in addition, the average film thickness of the nonmagnetic material-contact layer is set in the range of 16 to 19 Å, the rate ($\Delta R/R$) of change in resistance and the unidirectional exchange bias magnetic field (Hex*) can both be improved to a satisfactory level as compared to the case in which the nonmagnetic material-noncontact layer and the nonmagnetic material-contact layer are both formed of CoFe or the case in which the nonmagnetic material-noncontact layer and the nonmagnetic material-contact layer are both formed of Co.

The NOL preferably has an intermittent structure in which a surface of the nonmagnetic material-noncontact layer is partially oxidized, and the nonmagnetic material-noncontact layer and the nonmagnetic material-contact layer are preferably directly bonded to each other at intermittent portions of the NOL.

When the NOL is formed to have the intermittent structure, magnetic coupling between the nonmagnetic material-noncontact layer and the nonmagnetic material-contact layer can be increased through the intermittent portions, and in particular, the unidirectional exchange bias magnetic field (Hex*) can be more effectively improved.

In addition, the NOL may have an intermittent structure which has Cr oxide layers partially formed on the nonmagnetic material-noncontact layer and oxide layers formed by partially oxidizing the surface of the nonmagnetic material-noncontact layer, and the nonmagnetic material-noncontact layer and the nonmagnetic material-contact layer are preferably directly bonded to each other at intermittent portions of the NOL.

In this embodiment, the NOL described above includes the Cr oxide layers. By the structure as described above, the NOL having an intermittent structure can be easily formed to have a uniform and small thickness. The NOL is may be formed by natural oxidation.

In addition, the surface of the NOL may have a high degree of planarization as compared to that of the surface of an NOL which is formed by using a CoFe alloy for the nonmagnetic material-contact layer instead of Co. In the case in which the nonmagnetic material-noncontact layer and the nonmagnetic material-contact layer are both formed of CoFe, by various heat treatments and the like performed in a manufacturing process, Fe of CoFe used for the nonmagnetic material-contact layer is oxidized, and as a result, the degree of planarization of the surface of the NOL is decreased.

On the other hand, in a structure in which the nonmagnetic material-noncontact layer is formed of CoFe, and the nonmagnetic material-contact layer is formed of Co, Co forming the nonmagnetic material-contact layer is not likely to be oxidized as compared to Fe, and the degree of planarization of the surface of the NOL is higher than the case in which CoFe is used for the nonmagnetic material-contact layer. Hence, the mirror reflection effect of the NOL is increased, and the rate ($\Delta R/R$) of change in resistance can be effectively improved.

The fixed magnetic layer is composed of a nonmagnetic material-noncontact layer formed using CoFe, an NOL, and a nonmagnetic material-contact layer formed using Co. The NOL described above is formed by oxidation of the surface of the nonmagnetic material-noncontact layer.

In addition to the optimization of the materials described above, since the average film thickness of the nonmagnetic material-contact layer is set in the range of 16 to 19 Å, compared to a three-layered structure composed of CoFe, an NOL, and CoFe or a three-layered structure composed of Co, an NOL, and Co, which has been conventionally used, the rate ($\Delta R/R$) of change in resistance and the unidirectional exchange bias magnetic field Hex* can both be improved to a satisfactory level.

BRIEF DESCRIPTION OF THE DRAWINGS

FIG. 10 is a graph showing the relationship between the unidirectional exchange bias magnetic field and the rate of change in resistance according to Example 1 and Comparative Examples 1 and 2;

FIG. 11 is a graph showing the relationship between the rate of change in resistance and the film thickness of a nonmagnetic material-contact layer according to Example 2 and Comparative Example 3;

DETAILED DESCRIPTION

Exemplary embodiments of the invention may be better understood with reference to the drawings, but these embodiments are not intended to be of a limiting nature. Rather, the invention is to cover all modifications, equivalents, and alternatives falling within the spirit and scope of the invention which is set forth by the claims.

Figure 1:
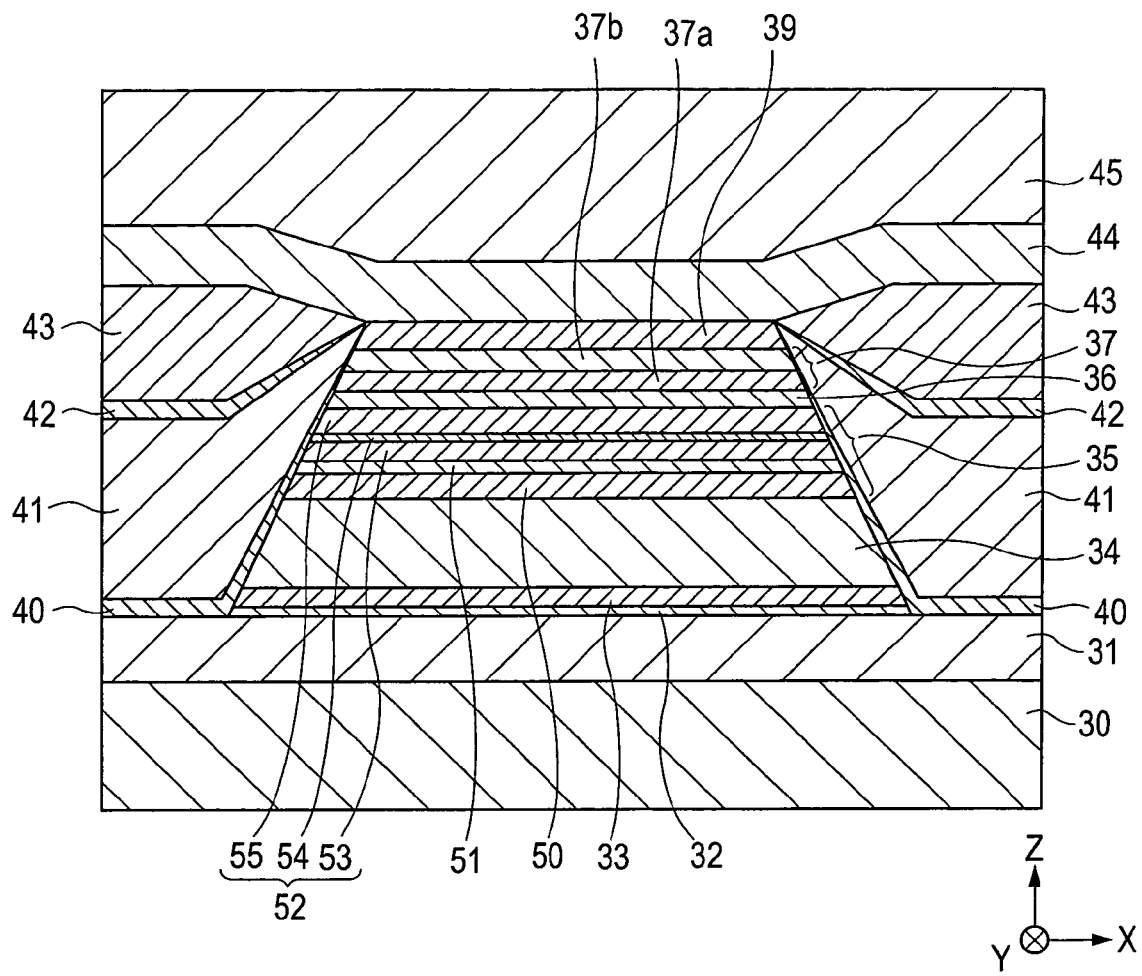
FIG. 1 is a cross-sectional view of a magnetic sensor according to a first embodiment, showing a surface facing a recording medium.

FIG. 1 is a cross-sectional view of a magnetic sensor of a first embodiment showing a view of a surface facing a recording medium.

The magnetic sensor shown in FIG. 1 is a so-called bottom type spin valve magnetic sensor composed of an antiferromagnetic layer 34, a fixed magnetic layer 35, a nonmagnetic material layer 36, and a free magnetic layer 37 are laminated to each other in that order.

The magnetization direction of the fixed magnetic layer 35 is appropriately fixed in a direction parallel to a Y direction in the figure, and in addition, the magnetization of the free magnetic layer 37 is appropriately fixed in a direction parallel to an X direction in the figure. The magnetization of the fixed magnetic layer 35 and that of the free magnetic layer 37 are perpendicular to each other. In addition, with respect to an external magnetic field from the magnetic medium, the magnetization of the free magnetic layer 37 sensitively varies, and due to the relationship between the variation of this magnetic direction and the fixed magnetization direction of the fixed magnetic layer 35, the electrical resistance is changed. Accordingly, by the change in voltage due to the change in electrical resistance described above, a leakage magnetic field from the recording medium is sensed.

In FIG. 1, a laminate is formed of an underlayer 32, a seed layer 33, an antiferromagnetic layer 34, a synthetic ferrimagnetic pinned type fixed magnetic layer 35 composed of a first fixed magnetic layer 50, a nonmagnetic interlayer 51, and a second fixed magnetic layer 52, a nonmagnetic material layer 36, a laminate type free magnetic layer 37 composed of a second free magnetic layer 37a and a first free magnetic layer 37b, and a protective layer 39. In this laminate, the width dimension of the upper surface of the laminate corresponds to a track width dimension.

Beneath the laminate described above, on a substrate (not shown in the figure), a lower shield layer 30, and a lower gap layer 31 are provided with an underlayer (not shown in the figure) interposed therebetween, the underlayer being formed of an insulating material such as alumina.

The antiferromagnetic layer 34 of the laminate described above may have a protruding portion protruding in the X direction in the figure from the individual layers provided above the antiferromagnetic layer 34.

As shown in FIG. 1, at side surfaces of the laminate, bias underlayers 40 are formed using Cr, Ti, Mo, $W_{50}Mo_{50}$, or the like.

On the bias layers 40, hard bias layers 41 are formed. The hard bias layer 41 is formed, for example, of a Co—Pt (cobalt-platinum) alloy or a Co—Cr—Pt (cobalt-chromium-platinum) alloy and is magnetized in the X direction (track width direction) in the figure.

On the hard bias layers 41, interlayers 42 made of a nonmagnetic material such as Ta are formed, and on this interlayers 42, electrode layers 43 made of Cr, Au, Ta, W or the like are formed.

On the surface of the laminate and the surfaces of the electrode layers 43, an upper gap layer 44 is formed, and on the upper gap layer 44, an upper shield layer 45 is formed. The upper shield layer 45 is covered with a protective layer which is not shown in the figure and which is made of an inorganic insulating material.

The lower shield layer 30 and the upper shield layer 45 are formed using a magnetic material such as NiFe. In this embodiment, the axes of easy magnetization of the lower shield layer 30 and the upper shield layer 45 are preferably aligned in the track width direction (X direction in the figure). In addition, the lower shield layer 30 and the upper shield layer 45 may be formed by a sputtering method, a plating method, or the like.

The lower gap layer 31, the upper gap layer 44, and the protective layer covering the upper shield layer 45 are formed using a nonmagnetic inorganic material such as $Al_2O_3$ or $SiO_2$.

The seed layer 33 preferably has a monolayer structure of a magnetic material layer or a nonmagnetic material layer in which the (111) plane of the face-centered cubic structure or the (110) plane of the body-centered cubic structure is preferentially oriented. Accordingly, in the crystal orientation of the antiferromagnetic layer 34, the (111) plane can be preferentially oriented, and hence the rate of change in resistance of the magnetic sensor can be improved.

In addition, the seed layer 33 preferably has a high resistance, and hence shunting of a sense current from the electrode layer 43 to the seed layer 33 can be suppressed. For example, the seed layer 33 may be formed of an NiFeY alloy (where Y is at least one selected from the group consisting of Cr, Rh, Ta, Hf, Nb, Zr, and Ti), and in addition, the underlayer 32 may be formed of at least one selected from the group consisting of Ta, Hf, Nb, Zr, T, Mo, and W. The underlayer 32 may not be provided.

The antiferromagnetic layer 34 is formed of a PtMn alloy, an X—Mn alloy (where X is at least one element selected from the group consisting of Pd, Ir, Rh, Ru, Os, and NiFe), or a Pt-Mn—X' alloy (where X' is at least one element selected from the group consisting of Pd, Ir, Rh, Ru, Au, Ag, Os, Cr, Ni, Ar, Ne, Xe, and Kr).

The alloys mentioned above each have a disordered face-centered cubic (fcc) structure right after the film formation and the structure is then transformed into a CuAuI type ordered face-centered tetragonal (fct) structure by heat treatment. In addition, depending on the composition (for example, the content of Mn is approximately 80 atomic percent), even when heat treatment is performed, the disordered face-centered cubic (fcc) structure may be maintained.

The film thickness of the antiferromagnetic layer 34 is 50 to 300 Å in the vicinity of the center in the track width direction and may be, for example, 120 Å.

When the alloy described above is used for the antiferromagnetic layer 34, and heat treatment is then performed therefor, an antiferromagnetic layer 34 can be obtained which generates a large exchange coupling magnetic field in cooperation with the first fixed magnetic layer 50.

The fixed magnetic layer 35 has a synthetic ferrimagnetic pinned structure composed of the first fixed magnetic layer 50 formed from a ferromagnetic material, the second fixed magnetic layer 52, and the nonmagnetic interlayer 51 formed from a nonmagnetic material. In this embodiment, the second fixed magnetic layer 52 is composed of a nonmagnetic material-contact layer 55 which is in contact with the nonmagnetic material layer 36, a nonmagnetic material-noncontact layer 53 which is in contact with the nonmagnetic interlayer 51, and an NOL (Nano-Oxide Layer) 54 which is formed between the nonmagnetic material-contact layer 55 and the nonmagnetic material-noncontact layer 53 by oxidizing the surface thereof and which has a mirror reflection effect.

The first fixed magnetic layer 50 is formed from a ferromagnetic material, such as a NiFe alloy, Co, a CoNiFe alloy, a CoFe alloy, or a CoNi alloy. In particular, when the first fixed magnetic layer 50 is formed from a CoFe alloy or a CoNiFe alloy, the value of a spin flop magnetic field can be preferably increased. Accordingly, the range of a magnetic field maintaining the ferrimagnetic state of the fixed magnetic layer 35 is increased, the fixed magnetic layer 35 can stably maintain the ferrimagnetic state, and a force (unidirectional exchange bias magnetic field) acting so as to fix the magnetization direction of the fixed magnetic layer 35 in a predetermined direction is increased.

The spin flop magnetic field is the intensity of an external magnetic field at which, when it is applied to two magnetic layers having magnetization directions antiparallel to each other, the magnetization directions described above become no longer antiparallel to each other. As the spin flop magnetic field is increased, the ferrimagnetic state can be more stably maintained even in an external magnetic field.

In addition, the nonmagnetic interlayer 51 is formed of a nonmagnetic material, such as one of Ru, Rh, Ir, Cr, Re, and Cu, or an alloy containing at least two elements mentioned above. In particular, the nonmagnetic interlayer 51 is preferably formed of Ru.

The first fixed magnetic layer 50 is formed so as to be in contact with the antiferromagnetic layer 34, and when heat treatment in a magnetic field is performed, the exchange anisotropic magnetic field is generated at the interface between the first fixed magnetic layer 50 and the antiferromagnetic layer 34 by exchange coupling, so that the magnetization direction of the first fixed magnetic layer 50 is fixed, for example, in the Y direction in the figure. When the magnetization direction of the first fixed magnetic layer 50 is fixed in the Y direction in the figure, the magnetization direction of the second fixed magnetic layer 52 facing thereto with the nonmagnetic interlayer 51 interposed therebetween is fixed antiparallel to the magnetization direction of the first fixed magnetic layer 50.

As described above, when the magnetization direction of the first fixed magnetic layer 50 and that of the second fixed magnetic layer 52 are placed in a ferrimagnetic state in which the magnetization directions thereof are antiparallel to each other, the first fixed magnetic layer 50 and the second fixed magnetic layer 52 fix the magnetization direction of the second fixed magnetic layer 52 and that of the first fixed magnetic layer 50, respectively, and as a result, the magnetization direction of the fixed magnetic layer 35 can be tightly fixed in a predetermined direction on the whole.

The nonmagnetic material layer 36 is a layer to prevent magnetic coupling between the fixed magnetic layer 35 and the free magnetic layer 37 and to allow a sense current to primarily flow therethrough, and may be formed of a nonmagnetic material, such as Cu, Cr, Au, or Ag, having conductivity. In particular, the nonmagnetic material layer 36 may be formed of Cu.

The second free magnetic layer 37a and the first free magnetic layer 37b, which form the free magnetic layer 37, are each formed of a ferromagnetic material, such as an NiFe alloy, Co, a CoFeNi alloy, a CoFe alloy, or a CoNi alloy. The second free magnetic layer 37a may not be formed, and the free magnetic layer 37 may have a synthetic ferrimagnetic free structure.

The first free magnetic layer 37b is formed, for example, of an NiFe alloy. Since thermal diffusion of the NiFe alloy is liable to occur between the first free magnetic layer 37b and the nonmagnetic material layer 36, in order to suppress the counter diffusion, the second free magnetic layer 37a, which is formed, for example, a CoFe alloy and has a diffusion-preventing effect, is provided between the first free magnetic layer 37b and the nonmagnetic material layer 36.

The protective layer 39 is formed of Ta or the like. In addition, the interlayer 42 provided between the electrode layer 43 and the hard bias layer 41 is formed of Ta or Cr, can prevent thermal diffusion and can also prevent the degradation of magnetic properties of the hard bias layer 41.

When Ta is used for the electrode layer 43, by providing the interlayer 42 made of Cr, the crystal structure of Ta provided on the upper layer of Cr can be formed into a body-centered cubic structure having a low resistance.

In addition, when Cr is used for the electrode layer 43, by providing the interlayer 42 made of Ta, Cr can be epitaxially grown, so that the resistance can be decreased.

When the bias underlayer 40 is formed of Cr, Ti, Mo, $W_{50}Mo_{50}$, or the like having a crystal structure represented by the bcc (body-centered cubic lattice) structure, the coercive force and the squareness ratio of the hard bias layer 41 are increased, and hence the bias magnetic field can be increased.

As described above, the second fixed magnetic layer 52 forming the fixed magnetic layer 35 is composed of the nonmagnetic material-contact layer 55 formed in contact with the nonmagnetic material layer 36, the nonmagnetic material-noncontact layer 53 which is located distant from the nonmagnetic material layer 36 and is formed in contact with the nonmagnetic interlayer 51, and the NOL 54 which is formed by oxidizing the surface of the nonmagnetic material-noncontact layer 53 and has a mirror reflection effect. In this embodiment, the "contact layer" or the "noncontact layer" is determined whether the layer is or is not in contact with the nonmagnetic material layer 36.

The nonmagnetic material-contact layer 55 is formed of Co, the nonmagnetic material-noncontact layer is formed of a CoFe layer, and in addition, the average thickness of the nonmagnetic material-contact layer 55 is formed in the range of 16 to 19 Å.

Figure 2:
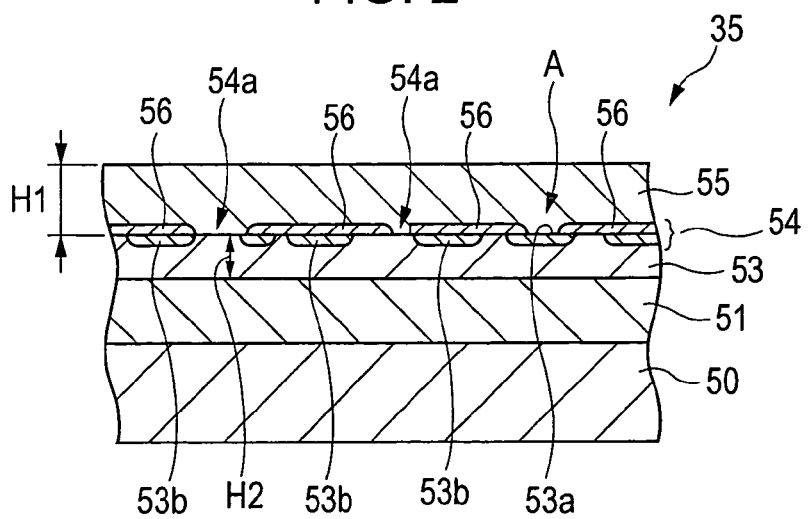
FIG. 2 is a partially enlarged cross-sectional view of a fixed magnetic layer forming the magnetic sensor shown in FIG. 1.

FIG. 2 is a partially enlarged cross-sectional view showing the fixed magnetic layer 35 shown in FIG. 1. As described above, the nonmagnetic material-noncontact layer 53 is formed of a CoFe alloy and an average thickness H2 of the nonmagnetic material-noncontact layer 53 is in the range of 3 to 8 Å. For example, the average thickness of the nonmagnetic material-noncontact layer 53 is approximately 5 Å.

As shown in FIG. 2, in a surface 53a of the nonmagnetic material-noncontact layer 53, oxide layers 53b are dispersedly formed by oxidation. The composition of the oxide layer 53b is CoFeO. When the surface 53a of the nonmagnetic material-noncontact layer 53 made of a CoFe alloy is processed by oxidation treatment, since Fe tends to be preferentially oxidized as compared to Co, the oxide layer 53b is formed as a layer in which the Fe is primarily oxidized.

As shown in FIG. 2, on the nonmagnetic material-noncontact layer 53, Cr oxide layers 56 are partially formed. The Cr oxide layers 56 and the oxide layers 53b collectively form the NOL 54.

As shown in FIG. 2, the NOL 54 has an intermittent structure, and at intermittent portions 54a, the surface 53a of the nonmagnetic material-noncontact layer 53 is exposed. In addition, at the intermittent portions 54a, the nonmagnetic material-contact layer 55 and the nonmagnetic material-noncontact layer 53 are in direct contact with each other, and at the intermittent portions 54a, the ferromagnetic coupling between the nonmagnetic material-contact layer 55 and the nonmagnetic material-noncontact layer 53 is increased.

In the embodiment shown in FIG. 2, the NOL 54 includes the Cr oxide layers 56; however, the Cr oxide layers 56 may not be formed. In the case described above, the NOL 54 is only composed of the oxide layers 53b formed by oxidation of the surface of the nonmagnetic material-noncontact layer 53. In addition, as described above, of the constituent elements of the CoFe alloy, since the Fe is likely to be oxidized as compared to the Co, the Co is likely to remain in non-oxidized state even after the oxidation treatment. Accordingly, after the nonmagnetic material-noncontact layer 53 is formed, when the surface thereof is oxidized (natural oxidation may be allowed to occur), since the Co remains in a non-oxidized state, the oxide layers 53b are likely to be formed to have an intermittent structure as shown in FIG. 2.

In addition, when the Cr oxide layers 56 are to be provided on the nonmagnetic material-noncontact layer 53, a Cr layer is first formed on a nonmagnetic material-noncontact layer formed of a CoFe alloy. The Cr layer has a very small film thickness, such as approximately 1 Å. When the Cr layer having a small thickness as described above is formed, the surface 53a of the nonmagnetic material-noncontact layer 53 is not entirely covered therewith, and the Cr layer is formed on parts of the surface. That is, when the Cr layer is formed, the intermittent portions 54a shown in FIG. 2 are formed in the Cr layer.

The Cr layer and the surface 53a of the nonmagnetic material-noncontact layer 53 are processed by oxidation treatment. Being very likely to be oxidized, the Cr layer is mostly oxidized to form the oxide layers 56. Furthermore, the nonmagnetic material-noncontact layer 53 located under the oxide layers 56 is also oxidized, and parts of the surface 53a of the nonmagnetic material-noncontact layer 53, which are located under the oxide layers 56, are placed in an oxidized state.

In addition, among the intermittent portions formed when the Cr layer is provided, at a portion A shown in FIG. 2, the surface 53a of the nonmagnetic material-noncontact layer 53 is oxidized to form the oxide layer 53b, and hence the portion A is blocked by the presence of the oxide layer 53b. As described above, parts of the surface 53a of the nonmagnetic material-noncontact layer 53, which are exposed at some intermittent portions formed when the Cr layer is provided as described above, may be oxidized so as to block the intermittent portions.

In addition, at the intermittent portions 54a shown in FIG. 2, parts of the surface 53a of the nonmagnetic material-noncontact layer 53 at least remain in a non-oxidized state, and the surface 53a of the nonmagnetic material-noncontact layer 53 are exposed at the intermittent portions 54a.

The Cr layer may be formed so that the NOL 54 has an intermittent structure having a small and uniform film thickness.

The structure of the NOL 54 shown in FIG. 2 is schematically shown and is used for purposes of illustrating how the nonmagnetic material-noncontact layer 53 and the Cr layer are oxidized. In particular, since the NOL 54 has a very small thickness (up to approximately 10 to 30 Å), it is very difficult to actually observe the boundary between the oxide layer 53b and the Cr oxide layer 56 as shown in FIG. 2; however, by composition analysis or the like, the presence of the Cr oxide layers 56 and the oxide layers 53 can be established. In addition, by TEM photographs shown later, the formation of the intermittent portions 54a in the NOL 54 can be observed.

When CoFe is used for the nonmagnetic material-noncontact layer 53, Co is used for the nonmagnetic material-contact layer 55, and the average film thickness of the nonmagnetic material-contact layer 55 is set in the range of 16 to 19 Å, both the rate ($\Delta R/R$) of change in resistance and the unidirectional exchange bias magnetic field Hex* can be appropriately. According to the experimental results which will be described later, and when compared to an example in which the nonmagnetic material-noncontact layer and the nonmagnetic material-contact layer are formed using CoFe under the same film formation conditions to have the same film thickness, the rate ($\Delta R/R$) of change in resistance according to the present invention can be improved. There may be several reasons therefor.

When Co is used for the nonmagnetic material-contact layer 55 as is the case of the present invention, since the content of impurity is smaller than that of a CoFe alloy, it is believed that the mean free path can be increased.

The basic principle of a GMR effect will be described with reference to FIG. 3. The theoretical discussion is consistent with the experimental observations, but it is presented solely to aid in understanding the experimental results presented.

In the structure in which a nonmagnetic material layer is provided between two magnetic layers (free magnetic layer and nonmagnetic material-contact layer), the case is to be considered in one in which the magnetization directions of the two magnetic layers are parallel.

In the case described above, it has been known that a majority spin electron in the magnetic layer, such as a conduction electron having an upward spin, has a longer mean free path than that of a minority spin electron such as a conduction electron having a downward spin. As the difference in free mean path between the conduction electron having an upward spin and the conduction electron having a downward spin is increased, the GMR effect is increased, and as a result, the rate of change in resistance can be improved.

Figure 3:
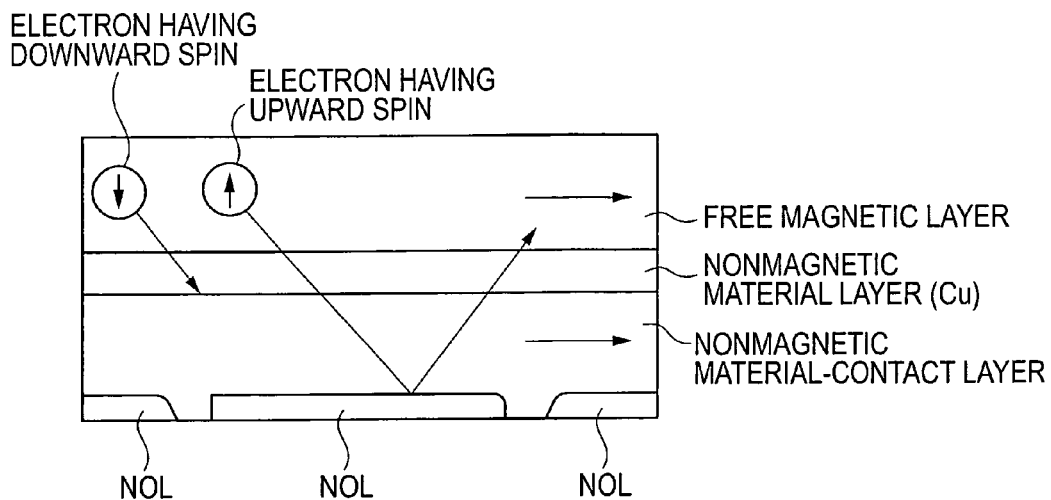
FIG. 3 is a schematic view for illustrating a function of a mirror reflection layer of a magnetic sensor.

Since layers contributing to the GMR effect are the free magnetic layer and the nonmagnetic material-contact layer shown in FIG. 3, when the mean free paths of the conduction electrons flowing through the above two layers are considered, the conduction electron having an upward spin makes mirror reflection at the surface of an NOL, and even after this reflection, since the spin state is maintained, as compared to the case in which the NOL is not provided, the mean free path of the conduction electron having an upward spin can be increased.

However, when the nonmagnetic material-contact layer is formed of a CoFe alloy, since the content of impurity is increased in the nonmagnetic material-contact layer, the conduction electron having an upward spin is liable to collide against the impurity; hence, diffusion and scattering are generated, and as a result, the mean free path of the conduction electron having an upward spin cannot be appropriately increased.

Accordingly, when Co having a smaller content of impurity than that of a CoFe alloy is used for the nonmagnetic material-contact layer, it is believed that the rate of diffusion and scattering caused by the collision against the impurity can be decreased, and that, as a result, the difference in mean free path between the conduction electron having an upward spin and the conduction electron having a downward spin can be increased so that the GMR effect can be increased.

The reason the rate of change in resistance can be increased relates to the heat treatment performed in a magnetic field after the individual layers are formed. The heat treatment is performed so as to generate the exchange coupling magnetic field between the antiferromagnetic layer 34 and the first fixed magnetic layer 50. In this heat treatment, when the nonmagnetic material-contact layer is formed of a CoFe alloy, since Fe forming the CoFe alloy is liable to be oxidized as compared to Co, oxygen or the like contained in an NOL migrates or diffuses toward the nonmagnetic material-contact layer side, and as a result, the surface of the NOL is liable to be roughened (that is, the degree of planarization is low). When the degree of planarization of the surface of the NOL is higher, the conduction electron having an upward spin is more likely to make a mirror reflection at the surface of the NOL. However, when the surface of the NOL is roughened, and the degree of planarization is decreased as described above, the conduction electron having an upward spin will not appropriately make a mirror reflection at the surface of the NOL, and diffusion and scattering are liable to occur. Hence, as a result, the difference in mean free path between the conduction electron having an upward spin and the conduction electron having a downward spin cannot be appropriately increased.

On the other hand, when Co is used for the nonmagnetic material-contact layer, even when the heat treatment in a magnetic field is performed, the Co is not likely to be oxidized, and the surface of the NOL maintains a clear mirror state. That is, the degree of planarization of the surface of the NOL is high when compared to that described above. As a result, it is believed that the difference in mean free path between the conduction electron having an upward spin and the conduction electron having a downward spin can be further increased compared to the case in which a CoFe alloy is used for the nonmagnetic material-contact layer, and that the GMR effect can be improved.

The degree of planarization is represented, for example, by the center line average roughness of the surface, and as the center line average roughness is smaller, the degree of planarization is higher.

In addition, it is also believe that a low resistance of the Co as compared to that of a CoFe alloy is one of the reasons for appropriately improving the GMR.

According to the experimental results which will be described later, it was found that the unidirectional exchange bias magnetic field (Hex*) can be improved as compared to a comparative example in which the nonmagnetic material-noncontact layer and the nonmagnetic material-contact layer are formed using Co under the same film formation conditions to have the same film thickness. The unidirectional exchange bias magnetic field (Hex*) is the intensity of a magnetic field including an exchange coupling magnetic field generated between the first fixed magnetic layer 50 and the antiferromagnetic layer 34, a coupling magnetic field by the RKKY interaction generated between the first fixed magnetic layer 50 and the nonmagnetic material-noncontact layer 53, a ferromagnetic coupling magnetic field generated between the nonmagnetic material-noncontact layer 53 and the nonmagnetic material-contact layer 55, and the like.

When a CoFe alloy is used for the nonmagnetic material-noncontact layer, and the surface of the nonmagnetic material-noncontact layer is processed by oxidation treatment, since Fe is preferentially oxidized, and Co is likely to remain in a non-oxidized state, as described in FIG. 2, the intermittent portions 54a are likely to be formed in the NOL 54 which is formed by oxidation treatment of the surface 53a of the nonmagnetic material-noncontact layer 53. When the intermittent portions 54a are present as described above, at the intermittent portions 54a, the nonmagnetic material-noncontact layer 53 and the nonmagnetic material-contact layer 55 are appropriately magnetically coupled with each other, and as a result, the unidirectional exchange bias magnetic field (Hex*) is increased.

However, when Co is used for the nonmagnetic material-noncontact layer, and the surface thereof is processed by oxidation treatment, the surface of the nonmagnetic material-noncontact layer is uniformly oxidized, and an NOL having the intermittent portions as shown in FIG. 2 is unlikely to be formed. Accordingly, a magnetic coupling between the nonmagnetic material-noncontact layer and the nonmagnetic material-contact layer is easily broken, and as a result, the unidirectional exchange bias magnetic field (Hex*) is liable to decrease as compared to that in the case in which a CoFe alloy is used for the nonmagnetic material-noncontact layer.

In particular, according to the experimental results which will be described later, it was found that when a laminate structure is formed of a nonmagnetic material-noncontact layer made of a CoFe, an NOL, and a nonmagnetic material-contact layer made of Co, and the thickness of the nonmagnetic material-contact layer is set in the range of 16 to 19 Å, a high unidirectional exchange bias magnetic field (Hex*) can be reliably obtained as compared to that in the case in which a laminate structure is formed of a nonmagnetic material-noncontact layer made of Co, an NOL, and a nonmagnetic material-contact layer made of Co, and in which the thickness of the nonmagnetic material-contact layer is set in the range of 16 to 19 Å.

In addition, as shown in FIG. 1, the fixed magnetic layer 35 preferably has a synthetic ferrimagnetic pinned structure composed of the first fixed magnetic layer 50, the nonmagnetic interlayer 51, and the second fixed magnetic layer 52 provided in that order from the bottom, and the second fixed magnetic layer 52 preferably has the structure composed of the nonmagnetic material-noncontact layer 53, the NOL 54, and the nonmagnetic material-contact layer 55 provided in that order from the bottom.

When the synthetic ferrimagnetic pinned structure is formed, the RKKY interaction acts between the first fixed magnetic layer 50 and the second fixed magnetic layer 52, the magnetization of the first fixed magnetic layer 50 and that of the second fixed magnetic layer 52 are placed in an antiparallel state, and in combination with the exchange coupling magnetic field generated between the first fixed magnetic layer 50 and the antiferromagnetic layer 34, the magnetization of the fixed magnetic layer 35 is tightly fixed as compared to the case in which, without using the synthetic ferrimagnetic pinned structure, the fixed magnetic layer only has a three-layered structure composed of the nonmagnetic material-noncontact layer 53, the NOL 54, and the nonmagnetic material-contact layer 55.

Figure 4:
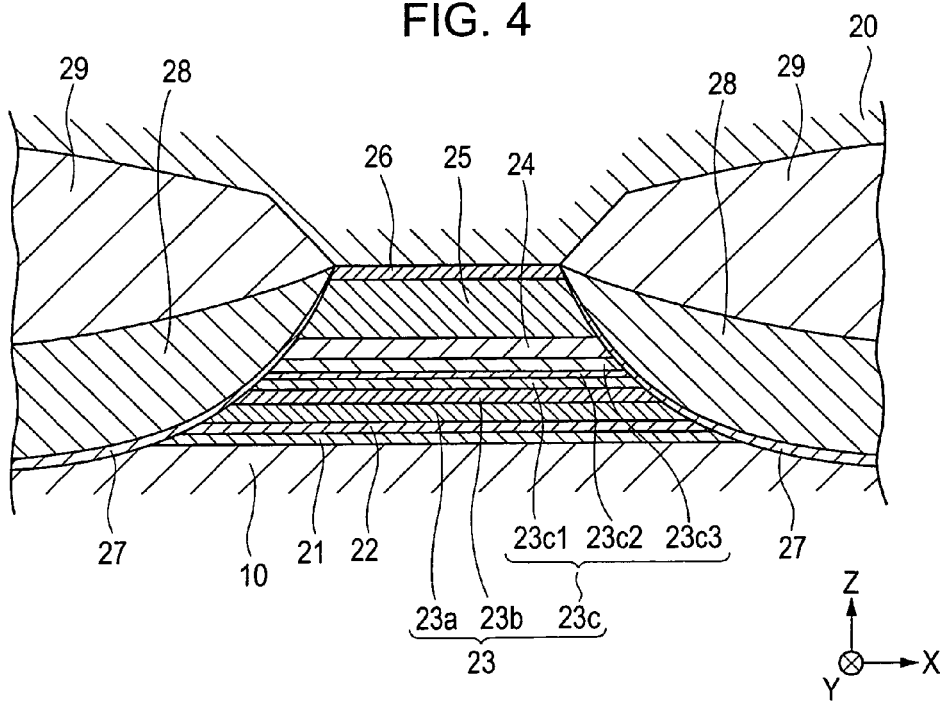
FIG. 4 is a cross-sectional view of a magnetic sensor according to a second embodiment showing a surface facing a recording medium.

FIG. 4 is a cross-sectional view of a magnetic sensor of another embodiment showing the surface facing a recording medium. A laminate is formed on a lower gap layer 10 composed of an insulating material such as alumina. The laminate is formed of a seed layer 21, a nonmagnetic metal layer 22, a fixed magnetic layer 23, a nonmagnetic material layer 24, a free magnetic layer 25, and a protective layer 26 provided in the order from the bottom.

The seed layer 21 is formed of a NiFe alloy, an NiFeCr alloy, Cr, or Ta. The seed layer 21 is formed, for example, of $(Ni_{0.8}Fe_{0.2})_{60\ atomic\ percent}Cr_{40\ atomic\ percent}$ having a thickness of 35 to 60 Å.

When the seed layer 21 is present, the [111] orientation of the nonmagnetic metal layer 22 is improved.

The fixed magnetic layer 23 has a synthetic ferrimagnetic pinned structure formed of a first fixed magnetic layer 23a, a second fixed magnetic layer 23c, and a nonmagnetic interlayer 23b interposed therebetween. The magnetization of the fixed magnetic layer 23 is fixed in a height direction (Y direction in the figure) by the unidirectional anisotropy thereof.

The nonmagnetic material layer 24 is a layer for preventing magnetic coupling between the fixed magnetic layer 23 and the free magnetic layer 25 and is preferably formed of a nonmagnetic material, such as Cu, Cr, Au, or Ag, having conductivity. In particular, the nonmagnetic material layer 24 is preferably formed using Cu. The film thickness of the nonmagnetic material layer is in the range of 17 to 30 Å.

The free magnetic layer 25 is formed of a magnetic material such as an NiFe alloy or a CoFe alloy. When the free magnetic layer 25 is formed of an NiFe alloy, a diffusion preventing layer (not shown in the figure) made of Co, CoFe, or the like is preferably formed between the free magnetic layer 25 and the nonmagnetic material layer 24. The film thickness of the free magnetic layer 25 is 20 to 60 Å. In addition, the free magnetic layer 25 may has a synthetic ferrimagnetic free structure composed of a plurality of magnetic layers with a nonmagnetic interlayer interposed therebetween.

The protective layer 26 is formed of Ta or the like and suppresses the progress of oxidation of the laminate described above. The thickness of the protective layer 26 is 10 to 50 Å.

On the two sides of the laminate formed of from the seed layer 21 to the protective layer 26, bias underlayers 27, hard bias layers 28, and electrode layers 29 are formed. By a longitudinal bias magnetic field from the hard bias layers 28, the magnetization of the free magnetic layer 25 is aligned in the track width direction (X direction in the figure).

The bias underlayers 27 are formed of Cr, W, or Ti, the hard bias layers 28 are formed, for example, of a Co—Pt (cobalt-platinum) alloy or a Co—Cr—Pt (cobalt-chromium-platinum) alloy, and the electrode layers 29 are formed of Cr, Ta, Rh, Au, W (tungsten), or the like.

On the electrode layers 29 and the protective layer 26, an upper gap layer 20 made of an insulating material such as alumina is provided. Although not being shown in the figure, a lower shield layer is provided under the lower gap layer 10, and on the upper gap layer 20, an upper shield layer is provided. The lower shield layer and the upper shield layer are formed of a soft magnetic material such as NiFe.

The magnetization of the free magnetic layer 25 is aligned in the track width direction (X direction in the figure) by a longitudinal bias magnetic field from the hard bias layers 28. Hence, with respect to a signal magnetic field (external magnetic field) from a recording medium, the magnetization of the free magnetic layer 25 sensitively varies.

By the relationship between the variation of the magnetization direction of the free magnetic layer 25 and the fixed magnetization direction (in particular, the fixed magnetization direction of the second fixed magnetic layer 23c) of the fixed magnetic layer 23, the electrical resistance changes, and by change in voltage or in current based on this change in electrical resistance, a leakage magnetic field from the recording medium is detected.

As described above, the fixed magnetic layer 23 of the magnetic sensor shown in FIG. 4 has a synthetic ferrimagnetic pinned structure formed of the first fixed magnetic layer 23a and the second fixed magnetic layer 23c with the nonmagnetic interlayer 23b interposed therebetween. The magnetization of the first fixed magnetic layer 23a and the magnetization of the second fixed magnetic layer 23c are placed in an antiparallel state by the RKKY interaction with the nonmagnetic interlayer 23b interposed therebetween.

In addition, the first fixed magnetic layer 23a is in contact with the nonmagnetic metal layer 22. The nonmagnetic metal layer 22 is formed of a PtMn alloy or an X—Mn alloy (where X is at least one selected from the group consisting of Pt, Pd, Ir, Rh, Ru, Os, Ni, and Fe). The film thickness of the nonmagnetic metal layer 22 is preferably in the range of 5 to 50 Å.

When the film thickness of the nonmagnetic metal layer 22 is in the range described above, the crystal structure of the nonmagnetic metal layer 22 maintains the face-centered cubic (fcc) structure which is formed at the film forming stage. It is not preferable that the film thickness of the nonmagnetic metal layer 22 is increased to more than 50 Å, since the crystal structure of the nonmagnetic metal layer 22 may be transformed into a CuAuI type ordered face-centered tetragonal (fct) structure when heat at a temperature of 250° C. or more is applied. However, even if the film thickness of the nonmagnetic metal layer 22 is more than 50 Å, when heat at a temperature of 250° C. or more is not applied, the nonmagnetic metal layer 22 maintains the face-centered cubic (fcc) structure which is the crystal structure formed at the film forming stage.

When the nonmagnetic metal layer 22 formed of a PtMn alloy or an X—Mn alloy (where X is at least one selected from the group consisting of Pt, Pd, Ir, Rh, Ru, Os, Ni, and Fe) has the face-centered cubic (fcc) crystal structure, the exchange coupling magnetic field is not generated at the interface between the nonmagnetic metal layer 22 and the first fixed magnetic layer 23a, or although being generated, the exchange coupling magnetic field is very small, and hence the magnetization direction of the first fixed magnetic layer 23a cannot be fixed by the exchange coupling magnetic field.

Accordingly, in the magnetic sensor shown in FIG. 4, the magnetization of the fixed magnetic layer 23 is fixed by the unidirectional anisotropy thereof. The magnetic sensor shown in FIG. 4 is called a self-pinning type magnetic sensor.

The self-pinning magnetic sensor can decrease the shunt loss as compared to a magnetic sensor made of an antiferromagnetic layer having a large thickness, such as approximately 200 Å, and hence a magnetic field detection output of the magnetic sensor can be improved. In addition, since the distance between the shield layers provided at the top and the bottom of the magnetic sensor can be decreased, improvement in recording density of a recording medium can be further achieved.

In the aspect shown in FIG. 4, of the induced magnetic anisotropy and the magnetic elastic effect, which determine the unidirectional anisotropy for fixing the magnetization of the fixed magnetic layer 23, the magnetic elastic effect is primarily used. The magnetic elastic effect is controlled by magnetic elastic energy. The magnetic elastic energy is characterized by a stress σ applied to the fixed magnetic layer 23 and a magnetostriction constant λ of the fixed magnetic layer 23.

As shown in FIG. 4, although the facing surface of the laminate to the recording medium is an open end, the other surfaces are covered with the hard bias layers 28, the electrode layers 29, and insulating layers which are not shown in the figure.

Accordingly, since stresses from the lower gap layer 20 and the upper gap layer 30, which are originally two-dimensionally isotropic, are released at the facing surface facing the recording medium, the symmetry is destroyed, and a tensile stress is applied to the laminate in the direction parallel to the height direction (Y direction in the figure). In addition, when a laminate film composed of the bias underlayer 27, the hard bias layer 28, and the electrode layer 29 has a compressive internal stress, since the electrode layer 29 tends to extend in an in-plane direction, compressive stresses are applied to the laminate described above in directions parallel and antiparallel to the track width direction (X direction in the figure).

That is, to the fixed magnetic layer 23 in which the facing surface facing to the recording medium is opened, a tensile stress in the height direction and a compressive stress in the track width direction are applied. In addition, the first fixed magnetic layer 23a is formed of a magnetic material having a positive magnetostriction constant, the axis of easy magnetization of the first fixed magnetic layer 23a is parallel to the rear side (height direction: Y direction in the figure) of the magnetic sensor by the magnetic elastic effect, and the magnetization direction of the first fixed magnetic layer 23a is fixed in the direction parallel or antiparallel to the height direction. The magnetization of the second fixed magnetic layer 23c is fixed in the direction antiparallel to the magnetization direction of the first fixed magnetic layer 23a by the RKKY interaction with the nonmagnetic interlayer 23b interposed therebetween.

By increasing the magnetostriction constant of the fixed magnetic layer 23, the magnetic elastic energy is increased, and as a result, the unidirectional anisotropy of the fixed magnetic layer 23 is increased. When the unidirectional anisotropy of the fixed magnetic layer 23 is increased, the magnetization thereof is tightly fixed in a predetermined direction, the output of the magnetic sensor is increased, and in addition, the stability and symmetry of the output are also improved.

In particular, the first fixed magnetic layer 23a forming the fixed magnetic layer 23 is bonded to the nonmagnetic metal layer 22 so that strain is generated in the crystal structure of the first fixed magnetic layer 23a, thereby increasing the magnetostriction constant λ thereof.

As described above, the nonmagnetic metal layer 22 has the fcc structure, and equivalent crystal planes represented by the (111) plane are preferentially oriented in the direction parallel to the interface.

In addition, when being formed of Co or $Co_xFe_y$ (where $y \leq 20$ and $x+y=100$ are satisfied), the first fixed magnetic layer 23a of the fixed magnetic layer 23 has the face-centered cubic lattice (fcc) structure. In addition, in the first fixed magnetic layer 23a, equivalent crystal planes represented by the (111) plane may be oriented in the direction parallel to the interface.

Accordingly, atoms forming the first fixed magnetic layer 23a and atoms forming the nonmagnetic metal layer 22 are likely to overlap each other; however, between the nearest interatomic distance in the (111) plane of the first fixed magnetic layer 23a and that in the (111) plane of the nonmagnetic metal layer 22, a predetermined difference therebetween exists.

While the atoms forming the first fixed magnetic layer 23a and atoms forming the nonmagnetic metal layer 22 are overlapped with each other, in order to generate a strain in the crystal structure for increasing the magnetostriction of the first fixed magnetic layer 23a, the content of Pt of the PtMn alloy or the content of element X of the X—Mn alloy, which is a material for the nonmagnetic metal layer 22, is adjusted.

For example, when the content of Pt of the PtMn alloy or the content of the element X of the X—Mn alloy is set to 51 atomic percent or more, the magnetostriction of the first fixed magnetic layer 23a overlapped with the nonmagnetic metal layer 22 is rapidly increased. In addition, when the content of Pt of the PtMn alloy or the content of the element X of the X—Mn alloy is in the range of 55 to 99 atomic percent, the structure is stabilized while a large magnetostriction of the first fixed magnetic layer described above is obtained.

When the difference between the nearest interatomic distance in the (111) plane of the nonmagnetic metal layer 22 and the nearest interatomic distance in the (111) plane of the first fixed magnetic layer 23a of the fixed magnetic layer 23 is divided by the nearest interatomic distance in the (111) plane of the first fixed magnetic layer 23a, the value (mismatch value) thus obtained may be set in the range of 0.05 to 0.20.

When the strain is generated in the crystal structure of the first fixed magnetic layer 23a, since the magnetostriction constant λ thereof can be increased, and as a result, a large magnetic elastic effect can be efficiently obtained.

The second fixed magnetic layer 23c forming the fixed magnetic layer 23 is composed of a nonmagnetic material-contact layer 23c3 formed in contact with the nonmagnetic material layer 24, a nonmagnetic material-noncontact layer 23c1 formed in contact with the nonmagnetic interlayer 23b, and an NOL 23c2 which is formed between the nonmagnetic material-contact layer 23c3 and the nonmagnetic material-noncontact layer 23c1 by oxidizing the surface thereof and may have a mirror reflection effect. In addition, the nonmagnetic material-contact layer 23c3 is formed of Co, the nonmagnetic material-noncontact layer 23c1 is formed of a CoFe alloy, and the average film thickness of the nonmagnetic material-contact layer 23c3 is formed in the range of 16 to 19 Å.

Accordingly, as is the description of the embodiment shown in FIG. 1, both the rate (ΔR/R) of change in resistance and the unidirectional exchange bias magnetic field (Hex*) can be improved to a practically usable level.

In addition, since the structure of the NOL 23c2 is equivalent to that shown in FIG. 2, detailed information thereon may be obtained from the description of the NOL 54.

When $Co_xFe_y$ (where $y \geq 20$ and $x+y=100$ are satisfied) having the bcc structure is used for the first fixed magnetic layer 23a and the nonmagnetic material-noncontact layer 23c1 of the second fixed magnetic layer 23c, a positive magnetostriction can be increased. The $Co_xFe_y$ (where $y \geq 20$ and $x+y=100$ are satisfied) having the bcc structure has a large coercive force, and hence the magnetization of the fixed magnetic layer 23 can be tightly fixed.

A method for manufacturing the magnetic sensor will be described, in particular, the fixed magnetic layer forming the magnetic sensor.

Figure 5:
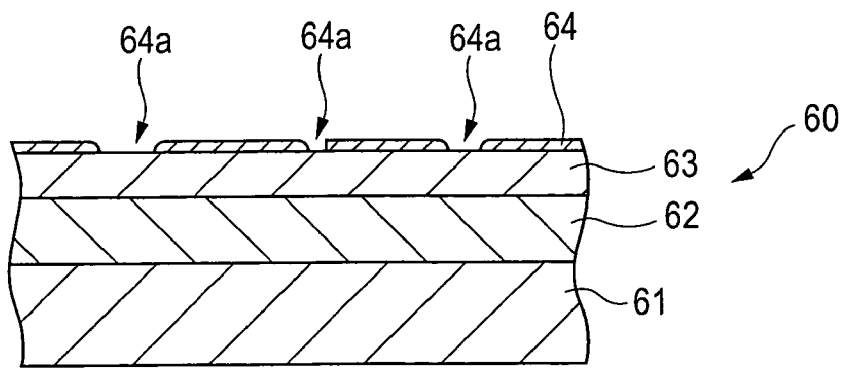
FIG. 5 is a partially enlarged cross-sectional view of a fixed magnetic layer in a semi-finished state for illustrating one step of a manufacturing method thereof
Figure 6:
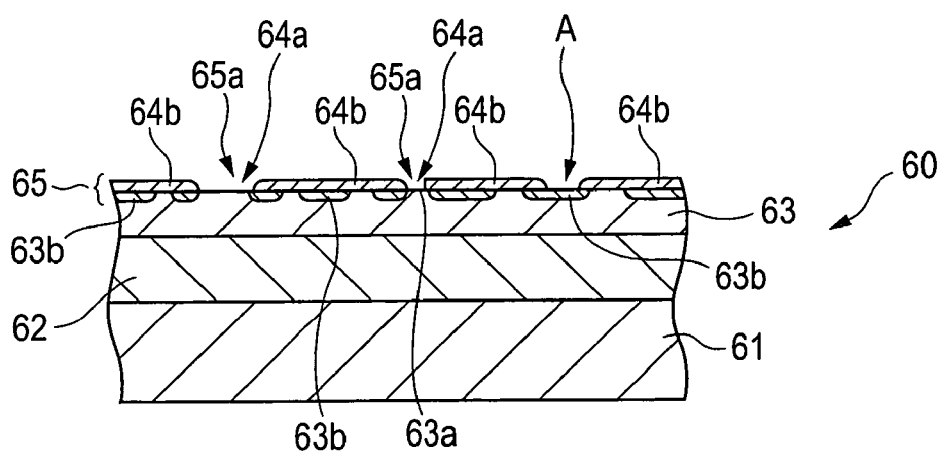
FIG. 6 is a partially enlarged cross-sectional view of the fixed magnetic layer in a semi-finished state for illustrating one step following the step shown in FIG. 5.
Figure 7:
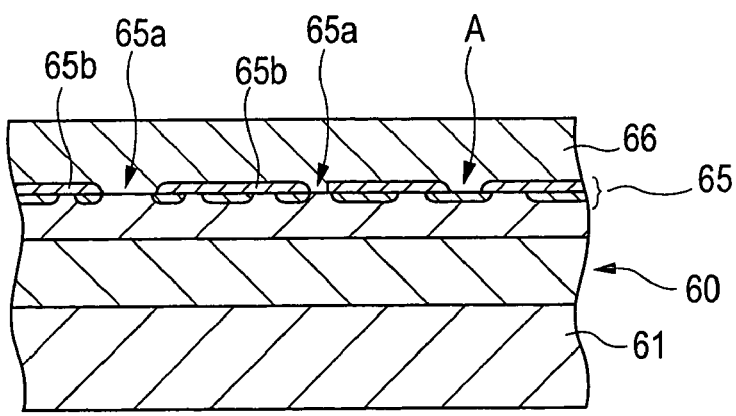
FIG. 7 is a partially enlarged cross-sectional view of the fixed magnetic layer for illustrating one step following the step shown in FIG. 6.

The individual layers forming the magnetic sensor may be formed by a sputtering method or a deposition method. FIGS. 5 to 7 are views each showing a step of a method for manufacturing a fixed magnetic layer 60.

In FIG. 5, on the antiferromagnetic layer 34 shown in FIG. 1 (or the nonmagnetic metal layer 22 shown in FIG. 4), a first fixed magnetic layer 61 forming the fixed magnetic layer 60 is formed using a CoFe alloy, a CoNiFe alloy, Co, an NiFe alloy, or the like. The first fixed magnetic layer 61 is preferably formed using a CoFe alloy. The thickness of the first fixed magnetic layer 61 is formed in the range of 10 to 20 Å.

Next, on the first fixed magnetic layer 61, a nonmagnetic interlayer 62 is formed using one of Ru, Rh, Ir, Cr, Re, and Cu, or an alloy containing at least two elements mentioned above.

Next, on this nonmagnetic interlayer 62, a nonmagnetic material-noncontact layer 63 forming a second fixed magnetic layer 66 is formed. The nonmagnetic material-noncontact layer 63 is formed using a CoFe alloy. The film thickness of the nonmagnetic material-noncontact layer 63 may be formed in the range of 3 to 8 Å. For example, the nonmagnetic material-noncontact layer 63 may be formed to have a thickness of 5 Å.

Subsequently, on the nonmagnetic material-noncontact layer 63, a Cr layer 64 is formed. The Cr layer 64 is formed to have an average thickness of approximately 1 Å. Since 1 Å is smaller than the diameter of an atomic particle, when being formed to have a very small thickness, such as approximately 1 Å as the average film thickness, the Cr layer 64 is not formed to entirely cover the nonmagnetic material-noncontact layer 63, and as a result, a state is obtained in which intermittent portions 64a are dispersedly formed in the Cr layer 64.

Next, oxidation treatment is performed. The oxidation may be performed by natural oxidation under oxidation conditions in the range of 500 L to 100 ML (0.07 Pa·S to 13.3 K Pa·S). In this embodiment, "L" indicates an oxygen partial pressure ($\mu$Torr)×an oxidation time (sec) (=1.33×10$^{-4}$ Pa·Sec). When the oxidation condition is less than 500 L (0.07 Pa·S), the Cr layer 64 and the surface of the nonmagnetic material-noncontact layer 63 may not be appropriately oxidized, and as a result, an NOL having an effective mirror reflection effect cannot be formed. On the other hand, when the oxidation condition is more than 100 ML (13.3 K Pa·S), the nonmagnetic material-noncontact layer 63 may be excessively oxidized, and an NOL having a large thickness and no intermittent portions is formed. As a result, the magnetic coupling between the nonmagnetic material-noncontact layer 63 and the nonmagnetic material-contact layer 66 may be decreased, and the unidirectional exchange bias magnetic field (Hex*) is disadvantageously decreased.

As shown in FIG. 6, by the oxidation treatment described above, the Cr layer 64 is oxidized and is transformed into Cr—O layers 64b. In addition, a surface 63a of the nonmagnetic material-noncontact layer 63 located under the Cr—O layers 64b and exposed at the intermittent portions 64a at the stage shown in FIG. 5 is partially oxidized.

However, since, in a CoFe alloy forming the nonmagnetic material-noncontact layer 63, Fe is likely to be oxidized as compared to Co, and Co is likely to remain in an non-oxidized state, when the oxidation is performed under the oxidation conditions described above, the surface 63a of the nonmagnetic material-noncontact layer 63 exposed at the intermittent portions 64a formed in the Cr layer 64 partially remain in a non-oxidized state, and the non-oxidized portions are used as intermittent portions 65a of an NOL 65 formed of the Cr—O layers 64b and the CoFe—O layers 63b.

When the NOL 65 having an intermittent structure as shown in FIG. 6 is formed to have a uniform and very small film thickness, the Cr layer 64 is formed on the nonmagnetic material-noncontact layer 63 in the step shown in FIG. 5, and in the step shown in FIG. 6, the Cr layer 64 is preferably oxidized to form the NOL 65 containing the Cr—O layers 64b.

In the NOL 65 described above, when the number of the intermittent portions is excessively increased due to an excessively small film thickness, or the degree of planarization of the surface is low due to strong surface undulation, since the ratio of conduction electrons having an upward spin, which make mirror reflection at the surface of the NOL 65, is decreased, the rate of change in resistance cannot be appropriately improved. However, on the other hand, when the intermittent portions 65a are not formed in the NOL 65, since the ferromagnetic coupling between the nonmagnetic material-noncontact layer 63 and the nonmagnetic material-contact layer 66 is decreased, a problem may arise in that the unidirectional exchange bias magnetic field (Hex*) cannot be sufficiently increased.

For example, when the Cr layer 64 is not formed in the step shown in FIG. 5, the NOL 65 is to be formed only by the CoFe—O layers 63b which are formed by oxidation of the surface 63a of the nonmagnetic material-noncontact layer 63. In order to increase the coupling magnetic field generated by the RKKY interaction between the nonmagnetic material-noncontact layer 63 and the fist fixed magnetic layer 61, in the CoFe alloy forming the nonmagnetic material-noncontact layer 63, the content of Co is preferably increased as compared to that of Fe. For example, the nonmagnetic material-noncontact layer 63 is formed using a $Co_{90}Fe_{10}$ alloy (the numerical value indicates atomic percent). That is, the amount of Fe contained in the nonmagnetic material-noncontact layer 63 is very small. Although Fe is liable to be oxidized as compared to Co as described above, the amount of Fe present in the vicinity of the surface of the nonmagnetic material-noncontact layer 63 is very small, and hence oxidation at the surface of the nonmagnetic material-noncontact layer 63 is unlikely to be accelerated. Accordingly, it is believed that under low oxidation conditions, an NOL having a considerably high ratio of the intermittent portions and a non-uniform thickness tends to be formed, and that on the other hand, under high oxidation conditions, an NOL having a small ratio of the intermittent portions tends to be formed since the oxidation of Co is also accelerated.

Accordingly, when the Cr layer 64 is formed on the nonmagnetic material-noncontact layer 63, and in particular, when the Cr layer 64 is provided to form an intermittent structure having a uniform and very small thickness, since the Cr layer is appropriately oxidized by natural oxidation treatment, an NOL 65 having a small film thickness can be formed in which portions other than the intermittent portions formed in the Cr layer 64 are at least appropriately oxidized.

Next, in the step shown in FIG. 7, on the NOL 65 and on the nonmagnetic material-noncontact layer 63 exposed at the intermittent portions 65a of the NOL 65, the nonmagnetic material-contact layer 66 is formed by a sputtering method or a deposition method.

Since the intermittent portions 65a are formed in the NOL 65 as shown in FIG. 7, the nonmagnetic material-noncontact layer 63 and the nonmagnetic material-contact layer 66 are brought into direct contact with each other at the intermittent portions 65a, and hence the ferromagnetic coupling therebetween is enhanced as compared to that obtained at the portion at which the NOL is provided between both layers.

In the present invention, the nonmagnetic material-contact layer 66 is formed from Co and the film thickness thereof is formed in the range of 16 to 19 Å. Subsequently, heat treatment in a magnetic field is performed, so that the exchange coupling magnetic field is generated between the antiferromagnetic layer 34 shown in FIG. 1 and the first fixed magnetic layer 61 of the fixed magnetic layer 60 shown in FIG. 7.

In this case, Co forming the nonmagnetic material-contact layer 66 may not be oxidized even by the heat treatment described above, and the migration in which oxygen in the NOL 65 diffuses toward the nonmagnetic material-contact layer side 66 may not occur. Hence, the surface 65b of the NOL 65 may not be roughened even by the heat treatment described above and is maintained as a mirror surface having a high degree of planarization.

In addition, by increasing the purity of a target used for forming the nonmagnetic material-contact layer 66, the nonmagnetic material-contact layer 66 may be prevented from being contaminated by impurities. For example, for the nonmagnetic material-contact layer 66, a Co target having a purity of 4N or more (purity of 99.99% or more, and the content of oxygen is approximately 20 ppm) is preferably used. When the nonmagnetic material-noncontact layer 63 is formed, a CoFe target having a purity of 3N (purity of 99.9%, and the content of oxygen is approximately 40 ppm) may be used.

Figure 8:
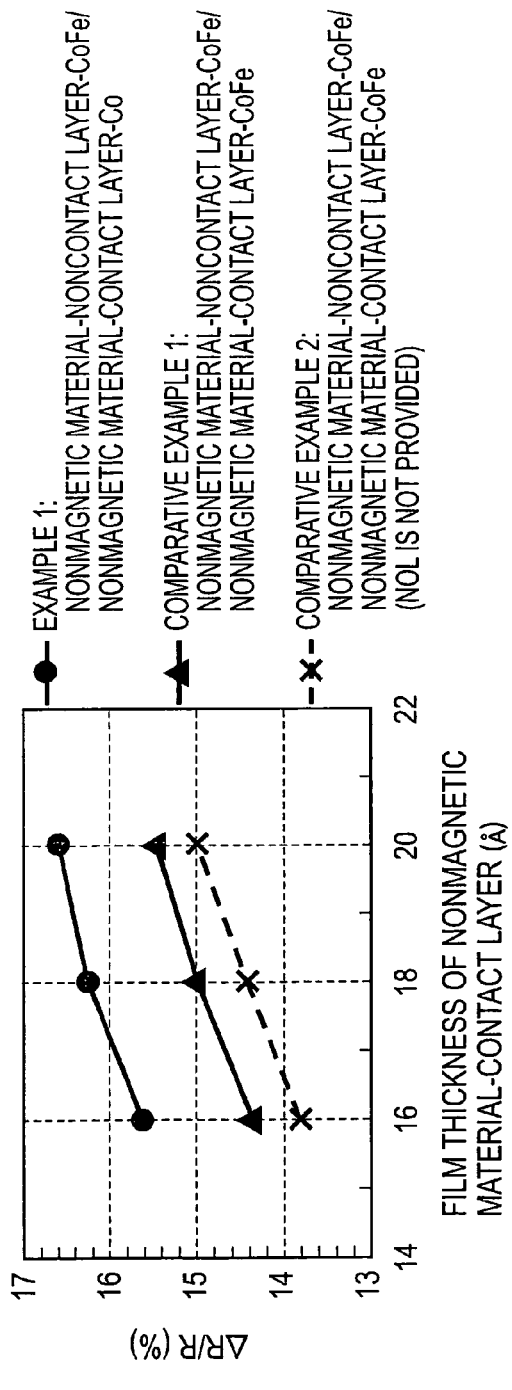
FIG. 8 is a graph showing the relationship between the rate of change in resistance and the film thickness of a nonmagnetic material-contact layer according to Example 1, and Comparative Examples 1 and 2.
Figure 9:
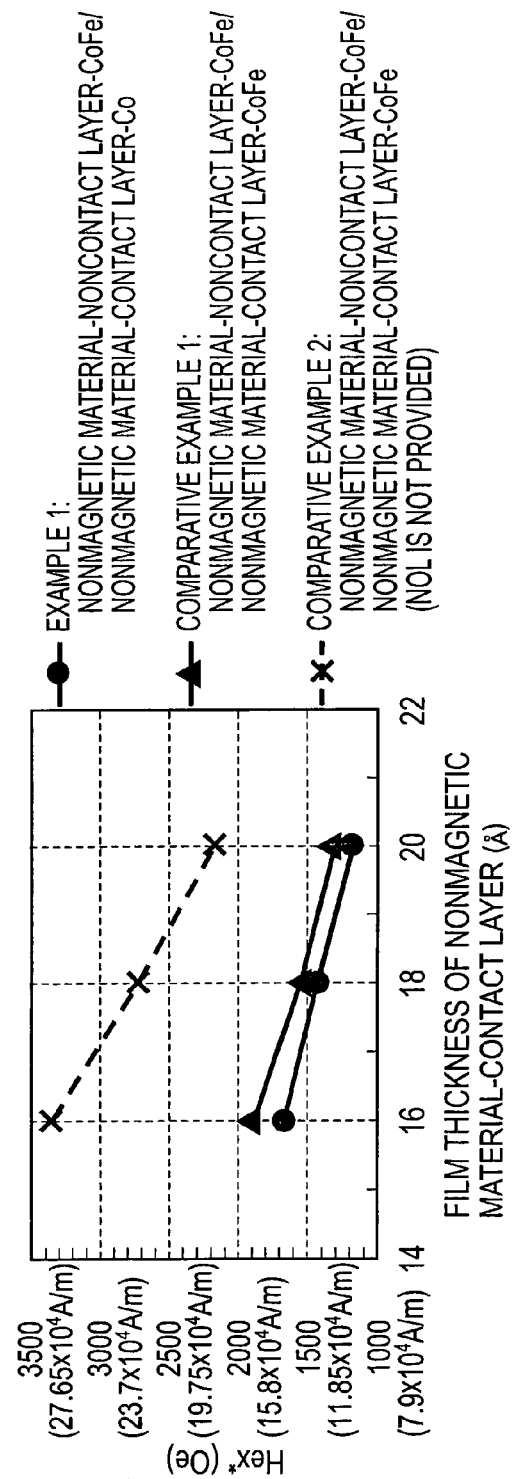
FIG. 9 is a graph showing the relationship between the unidirectional exchange bias magnetic field and the film thickness of the nonmagnetic material-contact layer according to Example 1 and Comparative Examples 1 and 2.

FIGS. 8 to 10 show experimental results of measurements of the relationship among the nonmagnetic material-contact layer, the rate ($\Delta R/R$) of change in resistance, and the unidirectional exchange bias magnetic field (Hex*) of a magnetic sensor formed from the following film composition 1.

The film composition 1 was Si/Al$_2$O$_3$/seed layer; (Ni$_{0.8}$Fe$_{0.2}$)$_{80}$Cr$_{40}$ (41)/antiferromagnetic layer; Pt$_{50}$Mn$_{50}$ (120)/first fixed magnetic layer; Co$_{90}$Fe$_{10}$ (14)/nonmagnetic interlayer; Ru (9)/nonmagnetic material-noncontact layer; Co$_{90}$Fe$_{10}$ (5)/Cr layer (1)/natural oxidation (10 KL)/nonmagnetic material-contact layer/nonmagnetic material layer; Cu (18)/free magnetic layer; [Co$_{90}$Fe$_{10}$ (10)/Ni$_{80}$Fe$_{20}$ (30)]/protective layer; Ta (30). The composition ratios of the individual layers are expressed on an atomic percent basis. In addition, numerical values in parentheses each indicate a film thickness, and the unit thereof is Å.

In addition, the natural oxidation described above was performed at 10 KL (1.4 Pa·S) after the nonmagnetic material-noncontact layer and the Cr layer were laminated to each other. By this natural oxidation treatment, an NOL was formed. This NOL was formed by oxidation of the Cr layer and the surface of CoFe forming the nonmagnetic material-noncontact layer.

Furthermore, after the film composition 1 was formed, the exchange coupling magnetic field was generated between the antiferromagnetic layer and the first fixed magnetic layer by heat treatment in a magnetic field, so that the magnetization of the first fixed magnetic layer was fixed in a predetermined direction. The magnetization relationship of the first fixed magnetic layer with the nonmagnetic material-noncontact layer and the nonmagnetic material-contact layer was antiparallel due to the RKKY interaction acting therebetween.

In the experiments, as Example 1, a magnetic sensor having the film composition 1 was formed in which Co was used for the nonmagnetic material-contact layer, and the relationships among the film thickness of the nonmagnetic material-contact layer, the rate ($\Delta R/R$) of change in resistance, and the unidirectional exchange bias magnetic field (Hex*) were obtained.

In addition, as Comparative Example 1, a magnetic sensor having the film composition 1 was formed in which CoFe was used for the nonmagnetic material-contact layer, and the relationships among the film thickness of the nonmagnetic material-contact layer, the rate ($\Delta R/R$) of change in resistance, and the unidirectional exchange bias magnetic field (Hex*) were obtained.

Furthermore, as Comparative Example 2, a magnetic sensor having the film composition 1 was formed in which CoFe was used for the nonmagnetic material-contact layer and in which the natural oxidation treatment was not performed (that is, the NOL was not formed), and the relationships among the film thickness of the nonmagnetic material-contact layer, the rate ($\Delta R/R$) of change in resistance, and the unidirectional exchange bias magnetic field (Hex*) were obtained.

FIG. 8 is a graph showing the relationship between the film thickness of the nonmagnetic material-contact layer and the rate ($\Delta R/R$) of change in resistance of the magnetic sensor. As shown in FIG. 8, in Example 1, Comparative Example 1, and Comparative Example 2, as the film thickness of the nonmagnetic material-contact layer was increased, the rate ($\Delta R/R$) of change in resistance was increased.

As shown in FIG. 8, among Example 1 and Comparative Examples 1 and 2, the largest rate of change in resistance was obtained in Example 1. The reasons for this are believed that, in Example 1 in which Co is used for the nonmagnetic material-contact layer, the mean free path of a conduction electron having an upward spin can be increased due to a small amount of impurities of the nonmagnetic material-contact layer as compared to that obtained in Comparative Examples 1 and 2 in which CoFe is used for the nonmagnetic material-contact layer, and that, in particular, since the NOL is formed by natural oxidation in Example 1, and the conduction electron described above reflects on the surface of the NOL while the spin thereof is maintained, the mean free path can be further increased.

In addition, since Co is unlikely to be oxidized as compared to CoFe, the Co is unlikely to be oxidized even by the heat treatment in a magnetic field described above, and the diffusion of oxygen contained in the NOL toward the nonmagnetic material-contact layer side is suppressed. As a result, it is believed that the degree of planarization of the surface of the NOL in Example 1 can be maintained at a higher level than that of the NOL obtained in Comparative Example 2, and that the degree of planarization may be one of the reasons the rate ($\Delta R/R$) of change in resistance in Example 1 can be significantly increased as compared to that in Comparative Examples 1 and 2.

FIG. 9 is a graph showing the relationship between the film thickness of the nonmagnetic material-contact layer and the unidirectional exchange bias magnetic field (Hex*). The unidirectional exchange bias magnetic field (Hex*) is the intensity of a magnetic field including an exchange coupling magnetic field generated between the first fixed magnetic layer and the antiferromagnetic layer, a coupling magnetic field by the RKKY interaction generated between the first fixed magnetic layer and the nonmagnetic material-noncontact layer, a ferromagnetic coupling magnetic field generated between the nonmagnetic material-noncontact layer and the nonmagnetic material-contact layer, and the like.

As shown in FIG. 9, in Example 1 and Comparative Examples 1 and 2, it was found that as the film thickness of the nonmagnetic material-contact layer is decreased, the unidirectional exchange bias magnetic field (Hex*) is increased.

The reason the unidirectional exchange bias magnetic field (Hex*) of Comparative Example 2 is considerably higher than that of Example 1 and Comparative Example 1 may be that the NOL is not formed. At a portion at which the NOL is formed, the magnetic coupling between the nonmagnetic material-noncontact layer and the nonmagnetic material-contact layer may be broken; however, in Comparative Example 2 in which the NOL is not formed, the breakage of the magnetic coupling as described above is unlikely to occur, and hence a high unidirectional exchange bias magnetic field (Hex*) is easily obtained in Comparative Example 2 as compared to that in Example 1 and Comparative Example 1. However, as shown in FIG. 8, the rate of change in resistance is decreased in Comparative Example 2, and as a result, a problem occurs in that the rate of change in magnetic resistance and the unidirectional exchange bias magnetic field may not be increased simultaneously.

As shown in FIG. 9, it was found that, in both Example 1 and Comparative Example 1, approximately equivalent unidirectional exchange bias magnetic fields are shown with respect to the film thickness of the nonmagnetic material-contact layer.

By the use of the experimental results shown in FIGS. 8 and 9, the relationship between the unidirectional exchange bias magnetic field (Hex*) and the rate ($\Delta R/R$) of change in magnetic resistance in Example 1, Comparative Example 1, and Comparative Example 2 is shown in FIG. 10.

As shown in FIG. 10, it was found that both the unidirectional exchange bias magnetic field and the rate of change in magnetic resistance may be increased only in Example 1.

When the experimental results shown in FIGS. 8 to 10 are taken into consideration, it was found that, in the case as Example 1 in which CoFe is used for the nonmagnetic material-contact layer, Co is used for the nonmagnetic material-noncontact layer, and the NOL is provided between the nonmagnetic material-contact layer and the nonmagnetic material-noncontact layer, when the film thickness of the nonmagnetic material-noncontact layer is set to 16 Å or more, a high rate of change in resistance can be obtained in Example 1 as compared to that in Comparative Examples 1 and 2 even when the film thickness of the nonmagnetic material-contact layer is increased to approximately 20 Å in Comparative Examples 1 and 2. In addition, as for the unidirectional exchange bias magnetic field, a low unidirectional exchange bias magnetic field could only be obtained in Example 1 as compared to that in Comparative Example 2; however, it was found that when compared with that of Comparative Example 1 at the same film thickness of the nonmagnetic material-contact layer, the unidirectional exchange bias magnetic field obtained in Example 1 is approximately equivalent to that of Comparative Example 1.

Figure 12:
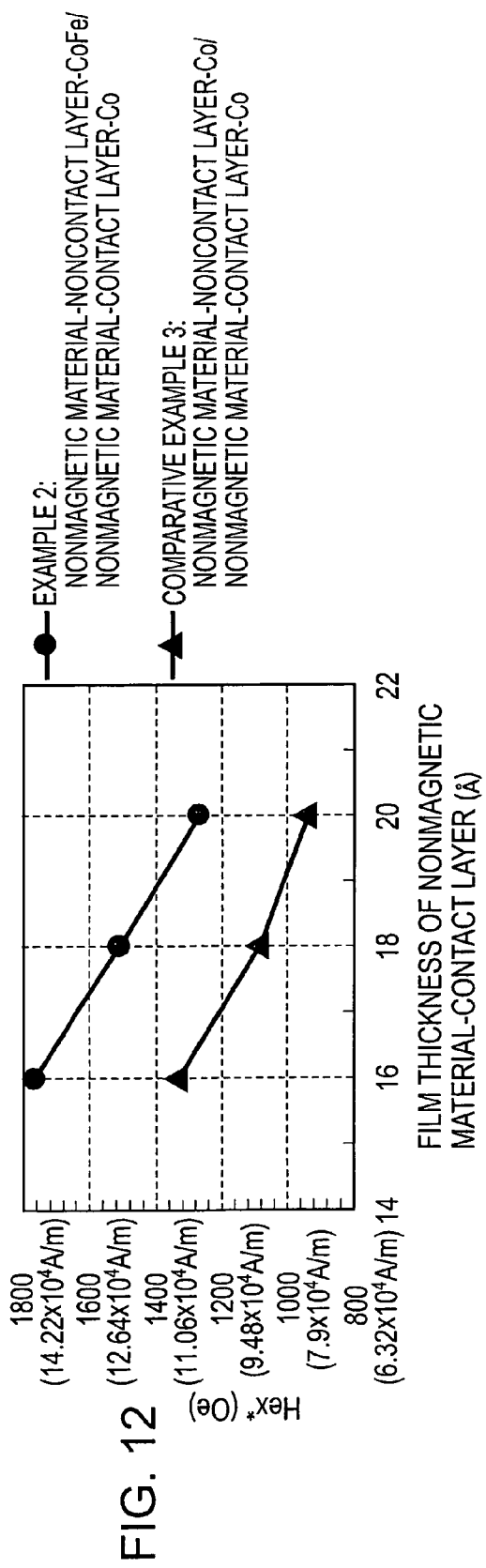
FIG. 12 is a graph showing the relationship between the unidirectional exchange bias magnetic field and the film thickness of the nonmagnetic material-contact layer according to Example 2 and Comparative Example 3.
Figure 13:
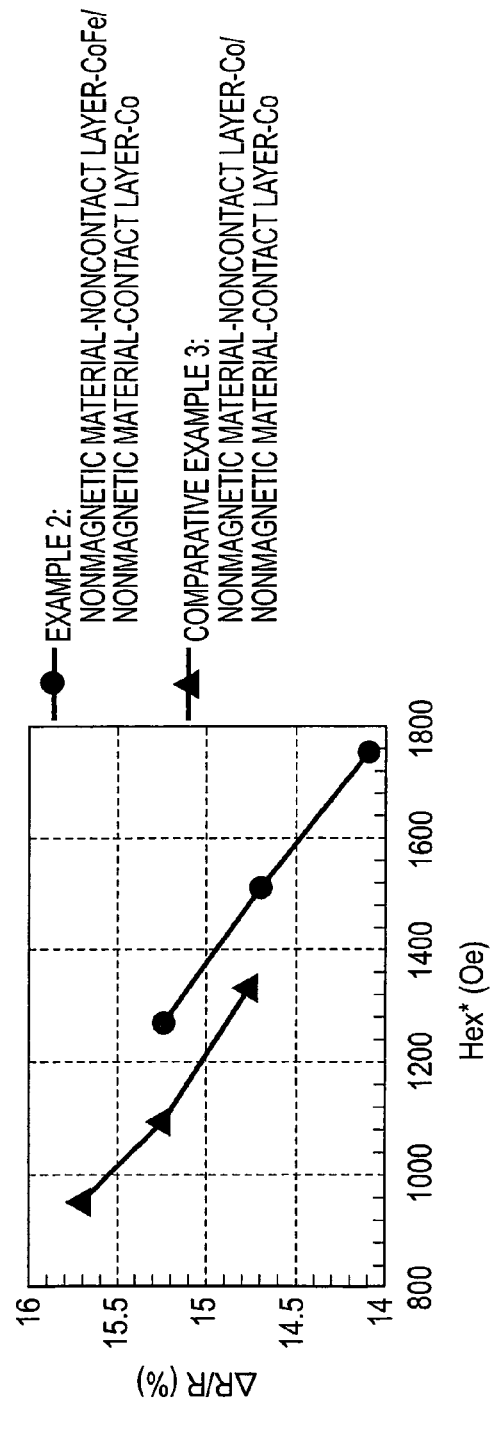
FIG. 13 is a graph showing the relationship between the unidirectional exchange bias magnetic field and the rate of change in resistance according to Example 2 and Comparative Example 3.

FIGS. 11 to 13 show experimental results of measurements of the relationship among the nonmagnetic material-contact layer, the rate ($\Delta R/R$) of change in resistance, and the unidirectional exchange bias magnetic field (Hex*) of a magnetic sensor formed from the following film composition 2.

The film composition 2 was Si/Al$_2$O$_3$/seed layer; (Ni$_{0.8}$Fe$_{0.2}$)$_{80}$Cr$_{40}$ (52)/antiferromagnetic layer; Pt$_{50}$Mn$_{50}$ (140)/first fixed magnetic layer; C$_{90}$Fe$_{10}$ (14)/nonmagnetic interlayer; Ru (9)/nonmagnetic material-noncontact layer; (5)/Cr layer (1)/natural oxidation (100 KL)/nonmagnetic material-contact layer: Co/nonmagnetic material layer; Cu (18)/free magnetic layer; [C$_{90}$Fe$_{10}$ (10)/Ni$_{80}$Fe$_{20}$ (35)]/protective layer; Ta (30). The composition ratios of the individual layers are expressed on an atomic percent basis. In addition, numerical values in parentheses each indicate a film thickness, and the unit thereof is Å.

In addition, the natural oxidation described above was performed at 100 KL (14 Pa·S) after the nonmagnetic material-noncontact layer and the Cr layer were laminated to each other. By this natural oxidation treatment, an NOL was formed. This NOL was formed by oxidation of the Cr layer and the surface of the nonmagnetic material-noncontact layer.

Furthermore, after the film composition described above was formed, the exchange coupling magnetic field was generated between the antiferromagnetic layer and the first fixed magnetic layer by heat treatment in a magnetic field, so that the magnetization of the first fixed magnetic layer was fixed in a predetermined direction. The magnetization relationship of the first fixed magnetic layer with the nonmagnetic material-noncontact layer and the nonmagnetic material-contact layer was antiparallel due to the RKKY interaction acting therebetween.

In the experiments, as Example 2, a magnetic sensor having the film composition 2 was formed in which CoFe was used for the nonmagnetic material-noncontact layer, and the relationships among the film thickness of the nonmagnetic material-contact layer (Co), the rate ($\Delta R/R$) of change in magnetic resistance, and the unidirectional exchange bias magnetic field (Hex*) were obtained.

In addition, as Comparative Example 3, a magnetic sensor having the film composition 2 was formed in which Co was used for the nonmagnetic material-noncontact layer, and the relationships among the film thickness of the nonmagnetic material-contact layer, the rate ($\Delta R/R$) of change in magnetic resistance, and the unidirectional exchange bias magnetic field (Hex*) were obtained.

FIG. 11 is a graph showing the relationship between the film thickness of the nonmagnetic material-contact layer and the rate ($\Delta R/R$) of change in resistance of the magnetic sensor. As shown in FIG. 11, in both Example 2 and Comparative Example 3, as the film thickness of the nonmagnetic material-contact layer was increased, the rate ($\Delta R/R$) of change in resistance was increased.

As shown in FIG. 11, the rate of change in magnetic resistance of Comparative Example 3 was higher than that of Example 2.

FIG. 12 is a graph showing the relationship between the film thickness of the nonmagnetic material-contact layer and the unidirectional exchange bias magnetic field (Hex*). The unidirectional exchange bias magnetic field (Hex*) is the intensity of a magnetic field including an exchange coupling magnetic field generated between the first fixed magnetic layer and the antiferromagnetic layer, a coupling magnetic field by the RKKY interaction generated between the first fixed magnetic layer and the nonmagnetic material-noncontact layer, a ferromagnetic coupling magnetic field generated between the nonmagnetic material-noncontact layer and the nonmagnetic material-contact layer, and the like.

As shown in FIG. 12, in both Example 2 and Comparative Example 3, it was found that as the film thickness of the nonmagnetic material-contact layer is increased, the unidirectional exchange bias magnetic field (Hex*) is decreased.

In addition, as shown in FIG. 12, the unidirectional exchange bias magnetic field of Example 2 was higher than that of Comparative Example 3.

In the case of Example 2, when the natural oxidation treatment is performed, Fe of CoFe of the nonmagnetic material-noncontact layer is preferentially oxidized as compared to Co, and Co is likely to remain in a non-oxidized state; hence, as a result, as described with reference to FIG. 2, the intermittent portions 54a are likely to be formed in the NOL 54. When the intermittent portions 54a are formed in the NOL 54, a magnetic coupling is generated between the nonmagnetic material-noncontact layer 53 and the nonmagnetic material-noncontact layer 55 at the intermittent portions 54a, and the unidirectional exchange bias magnetic field is enhanced.

On the other hand, as is the case of Comparative Example 3, when the nonmagnetic material-noncontact layer is formed using Co, since Co is uniformly oxidized, unlike the case shown in FIG. 2, the intermittent portions 54a are not easily formed in the NOL, and as a result, compared to the case of Example 2, a state is obtained in which the magnetic coupling between the nonmagnetic material-noncontact layer and the nonmagnetic material-contact layer is liable to be broken.

Accordingly, as shown in FIG. 12, it is believed that, compared to the case of Comparative Example 3, a high unidirectional exchange bias magnetic field is obtained in Example 2.

Based on the experimental results shown in FIGS. 11 and 12, FIG. 13 shows the relationship between the unidirectional exchange bias magnetic field (Hex*) and the rate ($\Delta R/R$) of change in magnetic resistance of Example 2 and Comparative Example 3.

As shown in FIG. 13, it was found that when the value of the unidirectional exchange bias magnetic field of Example 2 is the same as that of Comparative Example 3, the rate ($\Delta R/R$) of change in magnetic resistance of Example 2 is higher than that of Comparative Example 3. In addition, it was also found that when the film composition 2 is used, a unidirectional exchange bias magnetic field of not less than 1,400 Oe (=approximately $11.06 \times 10^4$ A/m, calculated on that 10 Oe is approximately equivalent to 79 A/m) cannot be obtained in Comparative Example 3.

From the experimental results shown in FIGS. 8 to 13, the following can be obtained. That is, as is the case of Examples 1 and 2, when CoFe is used for the nonmagnetic material-noncontact layer, Co is used for the nonmagnetic material-contact layer, and the NOL is provided between the nonmagnetic material-noncontact layer and the nonmagnetic material-contact layer, a high rate of change of magnetic resistance can always be obtained as compared to that of the case (Comparative Examples 1 and 2) in which CoFe is used for the nonmagnetic material-noncontact layer and the nonmagnetic material-contact layer and in which the thickness of the nonmagnetic material-contact layer is the same as that in the case described above. In addition, compared to the case (Comparative Example 3) in which Co is used for the nonmagnetic material-noncontact layer and the nonmagnetic material-contact layer, a high unidirectional exchange bias magnetic field can be obtained as long as the film thicknesses of the nonmagnetic material-contact layers is the same between the above two cases.

In addition, it was found that, in the case of Example 1, when the film thickness of the nonmagnetic material-contact layer is set in the range of 16 to 19 Å, although the film thickness of the nonmagnetic material-contact layer of Comparative Examples 1 and 2 is changed in the range of 16 to 20 Å as shown in FIG. 8, a high rate of change in magnetic resistance can be obtained in Example 1 as compared to that in Comparative Examples 1 and 2. In addition, it was also found that, although the film thickness of the nonmagnetic material-contact layer of Comparative Example 3 is changed in the range of 16 to 20 Å as shown in FIG. 12, a high unidirectional exchange bias magnetic field can be obtained in Example 2 as compared to that in Comparative Example 3.

Hence, the film thickness of the nonmagnetic material-contact layer in Examples 1 and 2 was set in the range of 16 to 19 Å.

FIGS. 14 to 19 are TEM photographs and schematic views thereof, the TEM photographs being obtained by the steps of cutting the magnetic sensors formed using the film compositions 1 and 2 in the film thickness direction, and taking photographs of the cross-sections of the sensors using a TEM.

Figure 14:
FIG. 14 is a TEM photograph according to Example 3.
Figure 15:
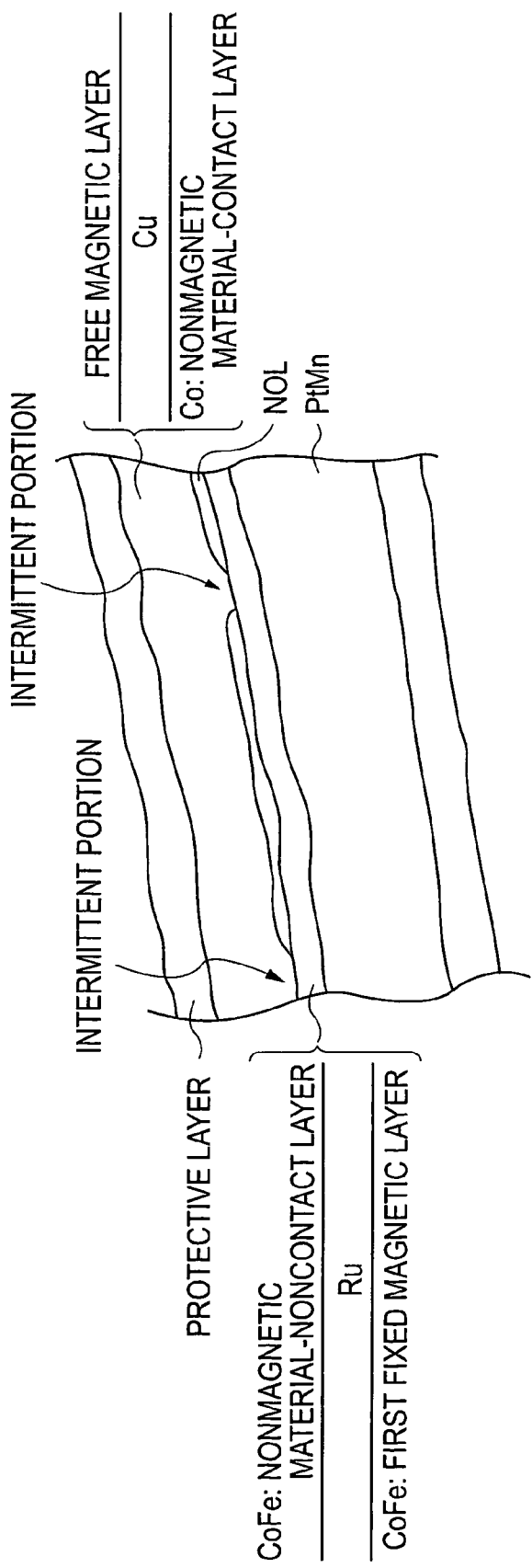
FIG. 15 is a partial schematic view of the TEM photograph shown in FIG. 14.

FIG. 14 is the TEM photograph of the magnetic sensor formed using the film composition 1 in Example 3 in which CoFe is used for the nonmagnetic material-noncontact layer, Co (film thickness of 18 Å) is used for the nonmagnetic material-contact layer, and the NOL is provided between the nonmagnetic material-noncontact layer and the nonmagnetic material-contact layer. FIG. 15 is a schematic view of a part of the TEM photograph shown in FIG. 14.

As shown in FIGS. 14 and 15, in the case of Example 3 (that is, the structure is composed of the nonmagnetic material-noncontact layer made of CoFe, the NOL, and the nonmagnetic material-contact layer made of Co), a plurality of intermittent portions is provided in the NOL, and the nonmagnetic material-noncontact layer and the nonmagnetic material-contact layer are directly bonded with each other at the intermittent portions. Furthermore, the surface of the NOL has a high degree of planarization as compared to that of the surface of an NOL of Comparative Examples 4 and 5 which will be described below.

Figure 16:
FIG. 16 is a TEM photograph according to Comparative Example 4.
Figure 17:
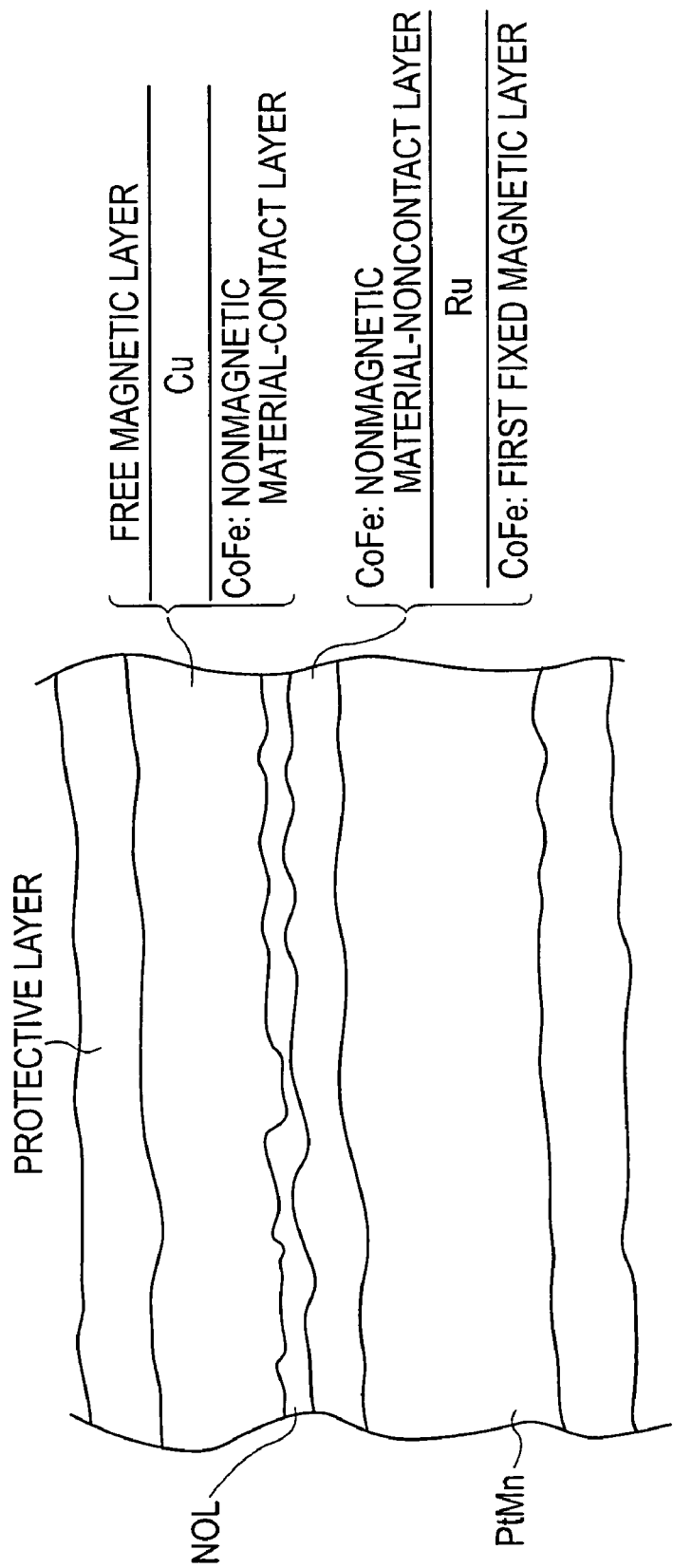
FIG. 17 is a partial schematic view of the TEM photograph shown in FIG. 16.

FIG. 16 is the TEM photograph of a magnetic sensor formed using the film composition 1 in Comparative Example 4 in which CoFe is used for the nonmagnetic material-noncontact layer, CoFe (film thickness of 18 Å) is used for the nonmagnetic material-contact layer, and the NOL is provided between the nonmagnetic material-noncontact layer and the nonmagnetic material-contact layer. FIG. 17 is a schematic view of a part of the TEM photograph shown in FIG. 16.

As shown in FIGS. 16 and 17, in the case of Comparative Example 4 (that is, the structure is composed of the nonmagnetic material-noncontact layer made of CoFe, the NOL, and the nonmagnetic material-contact layer made of CoFe), it was found that the surface of the NOL is considerably roughened as compared to that of Example 3, and that the degree of planarization is lower than that of Example 3. The reason for this is believed, as described with reference to FIG. 8, that when CoFe is used for the nonmagnetic material-contact layer, since Fe is liable to be oxidized as compared to Co, oxygen forming the NOL diffuses toward the nonmagnetic material-contact layer side by heat treatment in a magnetic field, and that, as a result, the surface of the NOL is roughened. When the degree of planarization of the surface of the NOL is low as that of Comparative Example 4, the decrease in rate of change in resistance may become a problem as described with reference to FIG. 8.

Figure 18:
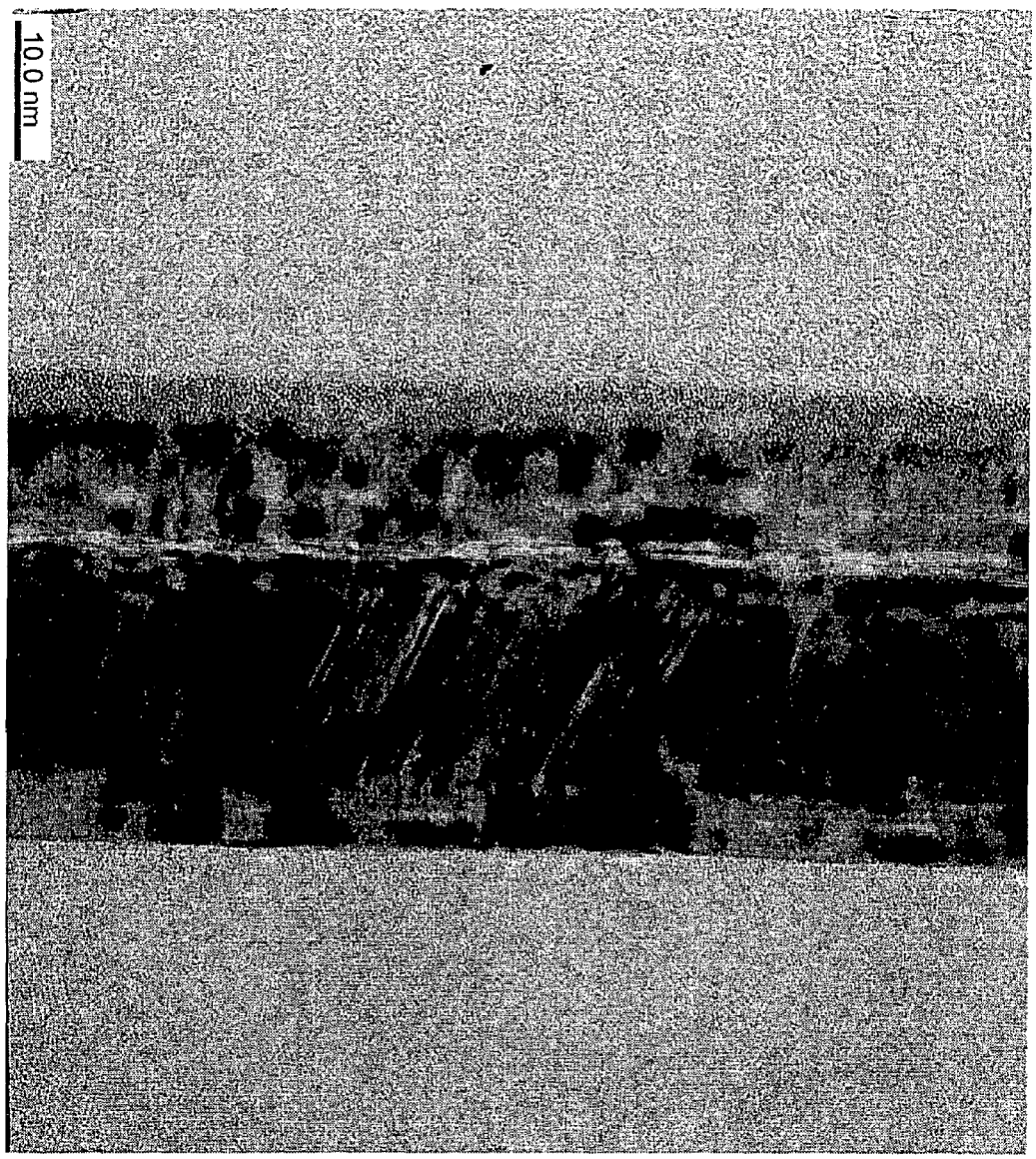
FIG. 18 is a TEM photograph according to Comparative Example 5.
Figure 19:
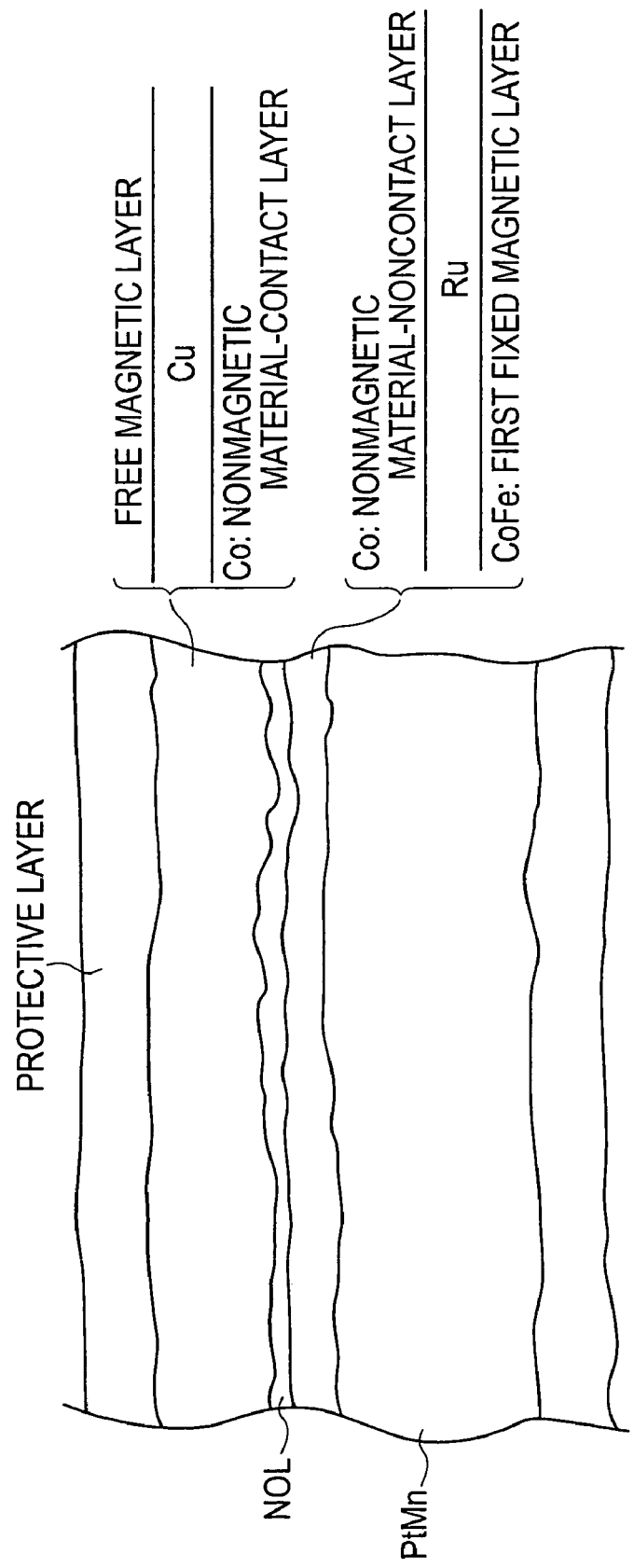
FIG. 19 is a partial schematic view of the TEM photograph shown in FIG. 18.

FIG. 18 is the TEM photograph of a magnetic sensor formed using the film composition 2 in Comparative Example 5 in which Co is used for the nonmagnetic material-noncontact layer, the film thickness of Co used for the nonmagnetic material-contact layer is set to 18 Å, and the NOL is provided between the nonmagnetic material-noncontact layer and the nonmagnetic material-contact layer. FIG. 19 is a schematic view of a part of the TEM photograph shown in FIG. 18.

As shown in FIGS. 18 and 19, in the case of Comparative Example 5 (that is, the structure is composed of the nonmagnetic material-noncontact layer made of Co, the NOL, and the nonmagnetic material-contact layer made of Co), it is believed that the degree of planarization of the NOL is equivalent to or higher (that is, the degree of planarization is superior) than that of the NOL of Comparative Example 4; however, unlike the case of Example 3, the intermittent portions are not formed in the NOL, and the NOL is formed over the entire nonmagnetic material-noncontact layer. Hence, it is believed that the magnetic coupling between the nonmagnetic material-noncontact layer and the nonmagnetic material-contact layer is broken on the whole by the presence of the NOL, and that, as a result, the unidirectional exchange bias magnetic field is decreased as described with reference to FIG. 12.

Although the present invention has been explained by way of the embodiments described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A magnetic sensor, comprising:
a laminate, comprising:
an antiferromagnetic layer;
   a fixed magnetic layer;
   a nonmagnetic material layer; and
   a free magnetic layer in which a magnetization thereof varies in accordance with an external magnetic field, the layers being provided in that order from the bottom;
   the fixed magnetic layer comprising:
      a nonmagnetic material-contact layer in contact with the nonmagnetic material layer;
      a nonmagnetic material-noncontact layer;
      a Nano-Oxide layer (NOL) between the nonmagnetic material-contact layer and the nonmagnetic material-noncontact layer, the NOL having an intermittent
      wherein the nonmagnetic material-contact layer is formed of Co, and the nonmagnetic material-noncontact layer is formed of a CoFe alloy,
      wherein the nonmagnetic material-contact layer and the nonmagnetic material noncontact layer have a ferromagnetic coupling and a same direction of magnetization; and
      wherein NOL is formed by depositing a Cr layer on the nonmagnetic material-noncontact layer, and oxidization of a surface of the Cr layer and the nonmagnetic material-noncontact layer.

2. The magnetic sensor according to claim 1, wherein the NOL has an intermittent structure in which a surface of the nonmagnetic material-noncontact layer is partially oxidized.

3. The magnetic sensor according to claim 1, wherein the NOL is formed by natural oxidation.

4. The magnetic sensor according to claim 1, wherein a surface of the NOL has a high degree of planarization as compared to that of a surface of an NOL having a CoFe alloy for the nonmagnetic material-contact layer.

5. A magnetic sensor, comprising:
a laminate, comprising:
an antiferromagnetic layer;
   a fixed magnetic layer;
   a nonmagnetic material layer; and
   a free magnetic layer in which a magnetization thereof varies in accordance with an external magnetic field, the layers being provided in that order from the bottom;
   the fixed magnetic layer comprising:
      a nonmagnetic material-contact layer in contact with the nonmagnetic material layer;
      a nonmagnetic material-noncontact layer; and
      a Nano-Oxide layer (NOL) between the nonmagnetic material-contact layer and the nonmagnetic material-noncontact layer, the NOL having an intermittent structure,
      wherein the nonmagnetic material-contact layer is formed of Co, and the nonmagnetic material-noncontact layer is formed of a CoFe alloy;
      wherein the nonmagnetic material-contact layer and the nonmagnetic material noncontact layer have a ferromagnetic coupling and a same direction of magnetization;
      wherein the NOL is formed by depositing a Cr layer on the nonmagnetic material-noncontact layer, and oxidization of a surface of the Cr layer and the nonmagnetic material-noncontact layer; wherein the Cr layer
has a thickness of approximately 1 Å.

6. A magnetic sensor, comprising:
a laminate, comprising:
an antiferromagnetic layer;
   a fixed magnetic layer;
   a nonmagnetic material layer; and
   a free magnetic layer in which a magnetization thereof varies in accordance with an external magnetic field, the layers being provided in that order from the bottom;
   the fixed magnetic layer comprising:
      a nonmagnetic material-contact layer in contact with the nonmagnetic material layer;
      a nonmagnetic material-noncontact layer; and
      a Nano-Oxide layer (NOL) between the nonmagnetic material-contact layer and the nonmagnetic material-noncontact layer, the NOL having an intermittent structure,
      wherein the nonmagnetic material-contact layer is formed of Co, and the nonmagnetic material-noncontact layer is formed of a CoFe alloy,
      wherein the nonmagnetic material-contact layer and the nonmagnetic material noncontact layer have a ferromagnetic coupling and a same direction of magnetization; and
      wherein a Cr layer is deposited on the nonmagnetic material-noncontact layer and the intermittent structure has a surface of the Cr layer and a surface of the nonmagnetic material-noncontact layer that are partially oxidized.

7. A magnetic sensor, comprising:
a laminate, comprising:
an antiferromagnetic layer;
   a fixed magnetic layer;
   a nonmagnetic material layer; and
   a free magnetic layer in which a magnetization thereof varies in accordance with an external magnetic field, the layers being provided in that order from the bottom;
   the fixed magnetic layer comprising:
      a nonmagnetic material-contact layer in contact with the nonmagnetic material layer;
      a nonmagnetic material-noncontact layer; and
         a Nano-Oxide layer (NOL) between the nonmagnetic material-contact layer and the nonmagnetic material-noncontact layer, the NOL having an intermittent structure,
      wherein the nonmagnetic material-contact layer is formed of Co, and the nonmagnetic material-noncontact layer is formed of a CoFe alloy,
      wherein the nonmagnetic material-contact layer and the nonmagnetic material noncontact layer have a ferromagnetic coupling and a same direction of magnetization;

wherein a Cr layer is deposited on the nonmagnetic material-noncontact layer and the intermittent structure has a surface of the Cr layer and a surface of the nonmagnetic material-noncontact layer that are partially oxidized; and wherein the Cr layer has a thickness of approximately 1 Å.

8. A magnetic sensor, comprising:
a laminate, comprising:
an antiferromagnetic layer;
  a fixed magnetic layer;
  a nonmagnetic material layer; and
  a free magnetic layer in which a magnetization thereof varies in accordance with an external magnetic field, the layers being provided in that order from the bottom;
  the fixed magnetic layer comprising:
    a nonmagnetic material-contact layer in contact with the nonmagnetic material layer;
    a nonmagnetic material-noncontact layer; and
    a Nano-Oxide layer (NOL) between the nonmagnetic material-contact layer and the nonmagnetic material-noncontact layer, the NOL having an intermittent structure,
    wherein the nonmagnetic material-contact layer is formed of Co, and the nonmagnetic material-noncontact layer is formed of a CoFe alloy;
      wherein the nonmagnetic material-contact layer and the nonmagnetic material noncontact layer have a ferromagnetic coupling and a same direction of magnetization;
      wherein the fixed magnetic layer has a synthetic ferrimagnetic pinned structure comprised of a first fixed magnetic layer, a nonmagnetic interlayer, and a second fixed magnetic layer provided in that order from the bottom, and the second fixed magnetic layer has a laminate structure composed of the nonmagnetic material-noncontact layer, the NOL, and the nonmagnetic material-contact layer provided in that order from the bottom; and
      wherein the NOL is formed by depositing a Cr layer on the nonmagnetic material-noncontact layer, and oxidization of a surface of the Cr layer and the nonmagnetic material-noncontact layer.

9. The magnetic sensor according to claim 8, wherein the Cr layer has a thickness of approximately 1 Å.

10. A magnetic sensor, comprising:
a laminate, comprising:
an antiferromagnetic layer;
  a fixed magnetic layer;
  a nonmagnetic material layer; and
  a free magnetic layer in which a magnetization thereof varies in accordance with an external magnetic field, the layers being provided in that order from the bottom;
  the fixed magnetic layer comprising:
    a nonmagnetic material-contact layer in contact with the nonmagnetic material layer;
    a nonmagnetic material-noncontact layer; and
    a Nano-Oxide layer (NOL) between the nonmagnetic material-contact layer and the nonmagnetic material-noncontact layer, the NOL having an intermittent structure,
    wherein the nonmagnetic material-contact layer is formed of Co, and the nonmagnetic material-noncontact layer is formed of a CoFe alloy,
      wherein the nonmagnetic material-contact layer and the nonmagnetic material noncontact layer have a ferromagnetic coupling and a same direction of magnetization;
      wherein the fixed magnetic layer has a synthetic ferrimagnetic pinned structure comprised of a first fixed magnetic layer, a nonmagnetic interlayer, and a second fixed magnetic layer provided in that order from the bottom, and the second fixed magnetic layer has a laminate structure composed of the nonmagnetic material-noncontact layer, the NOL, and the nonmagnetic material-contact layer provided in that order from the bottom; and
      wherein a Cr layer is deposited on the nonmagnetic material-noncontact layer and the intermittent structure comprises a surface of the Cr layer and a surface of the nonmagnetic material-noncontact layer that are partially oxidized.

11. A magnetic sensor, comprising:
a laminate, comprising:
an antiferromagnetic layer;
  a fixed magnetic layer;
  a nonmagnetic material layer; and
  a free magnetic layer in which a magnetization thereof varies in accordance with an external magnetic field, the layers being provided in that order from the bottom;
  the fixed magnetic layer comprising:
    a nonmagnetic material-contact layer in contact with the nonmagnetic material layer;
    a nonmagnetic material-noncontact layer; and
    a Nano-Oxide layer (NOL) between the nonmagnetic material-contact layer and the nonmagnetic material-noncontact layer, the NOL having an intermittent structure,
    wherein the nonmagnetic material-contact layer is formed of Co, and the nonmagnetic material-noncontact layer is formed of a CoFe alloy,
      wherein the nonmagnetic material-contact layer and the nonmagnetic material noncontact layer have a ferromagnetic coupling and a same direction of magnetization
      wherein the fixed magnetic layer has a synthetic ferrimagnetic pinned structure comprised of a first fixed magnetic layer, a nonmagnetic interlayer, and a second fixed magnetic layer provided in that order from the bottom, and the second fixed magnetic layer has a laminate structure composed of the nonmagnetic material-noncontact layer, the NOL, and the nonmagnetic material-contact layer provided in that order from the bottom;
      wherein the NOL has an intermittent structure in which a surface of the nonmagnetic material-noncontact layer is partially oxidized; and
      wherein Cr layer has a thickness of approximately 1 Å.

12. A magnetic sensor, comprising:
a laminate, comprising:
an antiferromagnetic layer;
  a fixed magnetic layer;
  a nonmagnetic material layer; and
  a free magnetic layer in which a magnetization thereof varies in accordance with an external magnetic field, the layers being provided in that order from the bottom;

the fixed magnetic layer comprising:
  a nonmagnetic material-contact layer in contact with the nonmagnetic material layer;
  a nonmagnetic material-noncontact layer; and
  a Nano-Oxide layer (NOL) between the nonmagnetic material-contact layer and the nonmagnetic material-noncontact layer, the NOL having an intermittent structure,
    wherein the nonmagnetic material-contact layer is formed of Co, and the nonmagnetic material-noncontact layer is formed of a CoFe alloy, wherein the nonmagnetic material-contact layer and the nonmagnetic material noncontact layer have a ferromagnetic coupling and a same direction of magnetization; and
      wherein the NOL has an intermittent structure which has Cr oxide layers partially formed on the nonmagnetic material-noncontact layer and oxide layers formed by partially oxidizing a surface of the nonmagnetic material-noncontact layer, and the nonmagnetic material-noncontact layer and the nonmagnetic material-contact layer are directly bonded to each other at intermittent portions of the NOL.

13. A magnetic sensor, comprising:
a laminate, comprising:
  a fixed magnetic layer;
  a nonmagnetic material layer; and
  a free magnetic layer, provided in that order from the bottom;
  the fixed magnetic layer comprising:
    a first fixed magnetic layer;
    a nonmagnetic interlayer; and
    a second fixed magnetic layer, provided in that order from the
      wherein, the second fixed magnetic layer has a laminate structure, comprising:
        a nonmagnetic material-noncontact layer;
        a NOL; and
        a nonmagnetic material-contact layer, provided in that order from the bottom,
          wherein the nonmagnetic material-contact layer is formed of Co, the nonmagnetic material-noncontact layer is formed of a CoFe alloy; and
wherein, a magnetization of the fixed magnetic layer is fixed by a unidirectional anisotropy thereof, and
wherein the nonmagnetic material-contact layer and the nonmagnetic material noncontact layer have a ferromagnetic coupling and a same direction of magnetization; and
wherein NOL is formed by depositing a Cr layer on the nonmagnetic material-noncontact layer, and oxidization of a surface of the Cr layer and the nonmagnetic material-noncontact layer.

14. The magnetic sensor according to claim 13, wherein the NOL has an intermittent structure in which a surface of the nonmagnetic material-noncontact layer is partially oxidized.

15. The magnetic sensor according to claim 14, wherein the nonmagnetic material-contact layer and the nonmagnetic material-noncontact layer are directly bonded to each other at intermittent portions of the NOL.

16. A magnetic sensor, comprising:
a laminate, comprising:
  a fixed magnetic layer;
  a nonmagnetic material layer; and
  a free magnetic layer, provided in that order from the bottom;
  the fixed magnetic layer comprising:
    a first fixed magnetic layer;
    a nonmagnetic interlayer; and
    a second fixed magnetic layer, provided in that order from the bottom;
      wherein, the second fixed magnetic layer has a laminate structure, comprising:
        a nonmagnetic material-noncontact layer;
        NOL; and
        a nonmagnetic material-contact layer, provided in that order from the bottom,
          wherein the nonmagnetic material-contact layer is formed of Co, the nonmagnetic material-noncontact layer is formed of a CoFe alloy; and
wherein, a magnetization of the fixed magnetic layer is fixed by a unidirectional anisotropy thereof, and
wherein the nonmagnetic material-contact layer and the nonmagnetic material noncontact layer have a ferromagnetic coupling and a same direction of magnetization;
wherein the NOL is formed by depositing a Cr layer on the nonmagnetic material-noncontact layer, and oxidization of a surface of the Cr layer and the nonmagnetic material-noncontact layer; and
wherein the Cr layer has a thickness of approximately 1 Å.

17. A magnetic sensor, comprising:
a laminate, comprising:
  a fixed magnetic layer;
  a nonmagnetic material layer; and
  a free magnetic layer, provided in that order from the bottom;
  the fixed magnetic layer comprising:
    a first fixed magnetic layer;
    a nonmagnetic interlayer; and
    a second fixed magnetic layer, provided in that order from the bottom;
      wherein, the second fixed magnetic layer has a laminate structure, comprising:
        a nonmagnetic material-noncontact layer;
        a NOL; and
        a nonmagnetic material-contact layer, provided in that order from the bottom,
          wherein the nonmagnetic material-contact layer is formed of Co, the nonmagnetic material-noncontact layer is formed of a CoFe alloy;
wherein, a magnetization of the fixed magnetic layer is fixed by a unidirectional anisotropy thereof;
wherein the nonmagnetic material-contact layer and the nonmagnetic material noncontact layer have a ferromagnetic coupling and a same direction of magnetization; and
wherein a Cr layer is deposited on the nonmagnetic material-noncontact layer and the NOL has an intermittent structure in which a surface of the Cr layer and a surface of the nonmagnetic material-noncontact layer are partially oxidized.

18. A magnetic sensor, comprising:
a laminate, comprising:
  a fixed magnetic layer;
  a nonmagnetic material layer; and
  a free magnetic layer, provided in that order from the bottom;
  the fixed magnetic layer comprising:
    a first fixed magnetic layer;
    a nonmagnetic interlayer; and a second fixed magnetic layer, provided in that order from the bottom;

wherein, the second fixed magnetic layer has a laminate structure, comprising:

a nonmagnetic material-noncontact layer;

a NOL; and a nonmagnetic material-contact layer, provided in that order from the bottom, wherein the nonmagnetic material-contact layer is formed of Co, the nonmagnetic material-noncontact layer is formed of a CoFe alloy; and wherein, a magnetization of the fixed magnetic layer is fixed by a unidirectional anisotropy thereof, and wherein the nonmagnetic material-contact layer and the nonmagnetic material noncontact layer have a ferromagnetic coupling and a same direction of magnetization;

wherein a Cr layer is deposited on the nonmagnetic material-noncontact layer and the NOL has an intermittent structure in which a surface of the Cr layer and a surface of the nonmagnetic material-noncontact layer are partially oxidized; and wherein the Cr layer has a thickness of approximately 1 Å.

19. The magnetic sensor according to claim 18, wherein the nonmagnetic material-contact layer and the nonmagnetic material-noncontact layer are directly bonded to each other at intermittent portions of the NOL.

20. A magnetic sensor comprising:

a laminate composed of at least an antiferromagnetic layer, a fixed magnetic layer in which a magnetization direction thereof is fixed, a nonmagnetic material layer, and a free magnetic layer in which a magnetization thereof varies in accordance with an external magnetic field, the layers of the laminate being provided in that order from the bottom, wherein the fixed magnetic layer has a nonmagnetic material-contact layer in contact with the nonmagnetic material layer, a nonmagnetic material-noncontact layer, and an NOL formed between the nonmagnetic material-contact layer and the nonmagnetic material-noncontact layer by oxidation of a surface of the nonmagnetic material-noncontact layer;

the nonmagnetic material-contact layer is formed of Co, the nonmagnetic material-noncontact layer is formed of a CoFe alloy;

the NOL includes a Cr layer on the nonmagnetic material-noncontact layer and has an intermittent structure in which the surface of the nonmagnetic material-noncontact layer is partially oxidized; and the nonmagnetic material-noncontact layer and the nonmagnetic material-contact layer are directly bonded to each other at intermittent portions of the NOL and have the same direction in magnetization.

* * * * *